United States Patent
Kikutake et al.

(10) Patent No.: US 7,212,453 B2
(45) Date of Patent: May 1, 2007

(54) SEMICONDUCTOR MEMORY HAVING AN ERROR CORRECTION FUNCTION

(75) Inventors: Akira Kikutake, Kawasaki (JP); Yasuhiro Onishi, Kawasaki (JP); Kuninori Kawabata, Kawasaki (JP); Junichi Sasaki, Kawasaki (JP); Toshiya Miyo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 145 days.

(21) Appl. No.: 11/155,731

(22) Filed: Jun. 20, 2005

(65) Prior Publication Data

US 2006/0133166 A1    Jun. 22, 2006

(30) Foreign Application Priority Data

Dec. 20, 2004 (JP) ............... 2004-368016
Mar. 15, 2005 (JP) ............... 2005-073391

(51) Int. Cl.
*G11C 29/00* (2006.01)
(52) U.S. Cl. ............ 365/200; 365/201; 365/198; 365/189.08
(58) Field of Classification Search ........... 365/200, 365/201, 198, 189.08
See application file for complete search history.

(56) References Cited

U.S. PATENT DOCUMENTS 6,430,073 B1 * 8/2002 Batson et al. ............ 365/49
7,106,642 B2 * 9/2006 Hojo ....................... 365/200
2001/0052090 A1   12/2001 Mio

FOREIGN PATENT DOCUMENTS

JP      05-054697       3/1993

* cited by examiner

*Primary Examiner*—Tuan T. Nguyen
(74) *Attorney, Agent, or Firm*—Arent Fox LLC.

(57) ABSTRACT

Regular data inputted/outputted to/from external terminals is read/written to/from a regular cell array, and parity data is read/written from/to a parity cell array. Since the parity data is generated by a parity generation circuit, it is difficult to write a desired pattern to the parity cell array. The regular data and the parity data are exchanged with each other by a switch circuit, so that the regular data can be written to the parity cell array and the parity data can be written to the regular cell array. This enables the write of desired data to the parity cell array. A test of the parity data can be easily conducted. In particular, a leakage test or the like between memory cells can be easily conducted.

16 Claims, 26 Drawing Sheets

|    | D1 | D2 | D3 | D4 | D5 | D6 | D7 | D8 |
|----|----|----|----|----|----|----|----|----|
| P1 | ○  | ○  |    |    |    |    | ○  | ○  |
| P2 | ○  | ○  | ○  |    |    | ○  | ○  |    |
| P3 |    |    | ○  | ○  | ○  | ○  |    | ○  |
| P4 |    |    |    | ○  | ○  |    | ○  | ○  |

TES1=L

S1=(D1^D4)^(D6^D7^D8)^P1

S2=(D1^D2)^(D5^D7^D8)^P2

S3=(D2^D3)^(D5^D6^D8)^P3

S4=(D3^D4)^(D5^D6^D7)^P4

TES1=H

|    | D1 | D2 | D3 | D4 | D5 | D6 | D7 | D8 |
|----|----|----|----|----|----|----|----|----|
| P1 | ○  | ○  | ○  | ○  |    |    ○ |    |    |
| P2 | ○  |    | ○  |    | ○  |    | ○  | ○  |
| P3 |    |    |    | ○  | ○  | ○  |    | ○  |
| P4 |    | ○  |    |    | ○  | ○  | ○  | ○  |

TES1=L

S1=(D2^D3^D4)^(D6^D7^P1)

S2=(D1^D3^D5)^(D7^D8^P2)

S3=(D1^D4^D5)^(D6^D8^P3)

S4=(D2^D5^D6)^(D7^D8^P4)

TES1=H

SEMICONDUCTOR MEMORY HAVING AN ERROR CORRECTION FUNCTION

CROSS-REFERENCE TO RELATED APPLICATIONS

This application is based upon and claims the benefit of priority from Japanese Patent Application Nos. 2004-368016 and 2005-073391, each filed on Dec. 20, 2004 and Mar. 15, 2005, the entire contents of which are incorporated herein by reference.

BACKGROUND OF THE INVENTION

1. Field of the Invention

The present invention relates to a semiconductor memory having an error correction function.

2. Description of the Related Art

A semiconductor memory having an error correction function has regular cell arrays storing externally supplied data and parity cell arrays storing parity data of data written to the regular cell arrays. The parity data are generated by a parity generation circuit according to the write data. Data read from the regular cell arrays are error-corrected by an error correction circuit according to the parity data. It is not generally easy to write desired data to the parity cell arrays, which makes a test of the parity cell arrays difficult.

As an art for easier testing of the parity cell arrays, for example, an art of forcibly inverting part of logical values of parity data to generate a pseudo error is disclosed (for example, Japanese Unexamined Patent Application Publication No. Hei 2001-351398 (Patent document 1)). Another art disclosed is an art in which a semiconductor memory is provided with an external parity data terminal for data read/write to/from a parity cell array in order to allow a desired pattern to be written to the parity cell array, and data are directly read/written from/to the parity cell array in a test mode (for example, Japanese Unexamined Patent Application Publication No. Hei 5-54697 (Patent document 2)).

The present invention was made to overcome the following problems. A semiconductor memory in Patent document 1 inverts part of bits of the parity data generated by a parity generation circuit. The parity data are generated as a result of logical operation on regular data written to regular cell arrays. Therefore, it is not possible to write desired data patterns to the parity cell arrays only by inverting part of the bits of the parity data.

In Patent document 2, it is possible to write desired patterns to the parity cell arrays. However, it is not possible to write desired patterns while a parity generation circuit and an error correction circuit are kept effective. In other words, it is not possible to write desired patterns to the parity cell arrays while the semiconductor memory is kept in an actual operation state. Moreover, forming the external parity data terminal (test pad) leads to an increase in chip size.

It is an object of the present invention to facilitate conducting a test of a semiconductor memory by writing desired data patterns to parity cell arrays. Another object is to write desired data patterns to the parity cell arrays while an error correction function is kept effective.

SUMMARY OF THE INVENTION

According to a first aspect of a semiconductor memory of the present invention, regular data inputted/outputted to/from an external data terminal is read/written from/to a regular cell array, and parity data is read/written from/to a parity cell array. Since the parity data is generated by a parity generation circuit, it is difficult to write a desired pattern to the parity cell array. The read data from the regular cell array is corrected by an error correction circuit according to the parity data. In this invention, a switch circuit exchanges the regular data and the parity data with each other to enable write of the regular data to the parity cell array and write of the parity data to the regular cell array. This makes it possible to write desired data to the parity cell array to facilitate conducting a test of the parity cell array. In particular, a leakage test and the like between memory cells can be easily conducted. Since only the storage destinations of the regular data and the parity data are exchanged, it is possible to conduct the test while the parity generation circuit and the error correction circuit are in operation. That is, the test can be conducted while the same circuit operations as normal operations are performed.

In a preferable example of the first aspect of the semiconductor memory of the present invention, a test control circuit activates a test signal in response to a test command in order to shift a state of the semiconductor memory from a normal operation mode to a test mode. The switch circuit makes a switch function effective in the test mode during which the test signal is active to input/output the regular data to/from the parity cell array and input/output the parity data to/from the regular cell array. On the other hand, the switch circuit makes the switch function ineffective in the normal operation mode during which the test signal is inactive to input/output the regular data to/from the regular cell array and input/output the parity data to/from the parity cell array. Controlling the operation of the switch circuit according to the test command can facilitate and ensure switching of the switch circuit.

In a preferable example of the first aspect of the semiconductor memory of the present invention, read amplifiers are provided for the regular cell array and the parity cell array, respectively, each of the read amplifiers being provided for each bit of read data in order to amplify an amount of signal of the read data. Write amplifiers are provided for the regular cell array and the parity cell array, respectively, each of the write amplifiers being provided for each bit of write data in order to amplify an amount of signal of the write data. The switch circuit is constituted of a plurality of sub switch circuits corresponding to the bits of the read/write data, respectively. Each of the sub switch circuits has a write selector and a read selector. The write selector outputs the write data to the write amplifier of one of the regular cell array and the parity cell array. The read selector outputs to a data line the read data from the read amplifier of one of the regular cell array and the parity cell array. Constituting the switch circuit of the plural sub switch circuits can facilitate circuit designing and shorten a design period.

In a preferable example of the first aspect of the semiconductor memory of the present invention, a write amplifier control circuit generates a regular write amplifier control signal causing the write amplifiers of the regular cell array to operate and a parity write amplifier control signal causing the write amplifiers of the parity cell array to operate. A write amplifier switch circuit exchanges the regular write amplifier control signal and the parity write amplifier control signal with each other. The write amplifier switch circuit is operated along with the switch circuit, so that the write amplifiers can be properly put into operation in exact timing with supply of the write data supplied to the write amplifiers. As a result, a malfunction of the semiconductor memory can be prevented.

In a preferable example of the first aspect of the semiconductor memory of the present invention, a test control circuit activates a test signal in response to a test command in order to shift a state of the semiconductor memory from a normal operation mode to a test mode. In the test mode during which the test signal is active, the write amplifier switch circuit outputs the regular write amplifier control signal to the write amplifiers of the parity cell array and outputs the parity write amplifier control signal to the write amplifiers of the regular cell array. On the other hand, in the normal operation mode during which the test signal is inactive, the write amplifier switch circuit outputs the regular write amplifier control signal to the write amplifiers of the regular cell array and outputs the parity write amplifier control signal to the write amplifiers of the parity cell array. Controlling the operation of the write amplifier switch circuit according to the test command can facilitate and ensure the switching of the write amplifier switch circuit.

In a preferable example of the first aspect of the semiconductor memory of the present invention, the regular data inputted/outputted to/from the external data terminal is read/written to/from one of a plurality of regular cell arrays according to an address. The regular data and the parity data are inputted/outputted to/from the regular cell arrays and the parity cell array through a data line. The switch circuit is disposed between the data line, and a predetermined one of the regular cell arrays and the parity cell array. The switch circuit exchanges the regular data read/written to/from the predetermined one of the regular cell arrays with the parity data. When the regular data is read/written to/from one of the plural regular cell arrays, the regular data and the parity data are exchanged with each other at a position close to the cell arrays, which enables the read/write of the parity data to/from a predetermined one of the regular cell arrays with a simple switch circuit. When, on the other hand, a switch circuit is disposed on an external data terminal side, the switch circuit is required to include address logic in order to write the parity data to a predetermined one of the regular cell arrays, which complicates the switch circuit.

In a preferable example of the first aspect of the semiconductor memory of the present invention, a syndrome generation circuit generates a syndrome according to the regular data and the parity data supplied through a data line disposed between the switch circuit, and the regular cell array and the parity cell array. The syndrome generation circuit has a switch part that switches a bit of the regular data, having been exchanged with a bit of the parity data by the switch circuit, back to a bit of the original regular data. Generally, a circuit (path) from the generation of the syndrome to error correction according to the syndrome often becomes a critical path, and circuit delay or the like has a direct influence on the read access time. In the present invention, since the data as a basis of generating the syndrome is supplied without passing through the switch circuit, so that delay elements of the critical path can be decreased. This can shorten the read access time.

In a preferable example of the first aspect of the semiconductor memory of the present invention, an arithmetic expression expressing logic of the syndrome generation circuit for generating each bit of the syndrome includes both the bit of the regular data and the bit of the parity data exchanged with each other by the switch circuit. That is, these bits are supplied to the syndrome generation circuit both before and after the exchange. This eliminates a need for a switch part corresponding to these bits, enabling reduction in circuit scale of the switch part. As a result, chip size of the semiconductor memory can be reduced.

In a second aspect of the semiconductor memory of the present invention, regular data inputted/outputted to/from an external data terminal is read/written from/to a regular cell array. Parity data is read/written from/to a parity cell array. Since the parity data is generated by a parity generation circuit, it is difficult to write a desired pattern to the parity cell array. The read data from the regular cell array is corrected by an error correction circuit according to the parity data. In the this invention, inversion circuits each invert a logical value of at least one bit of the parity data inputted/outputted to/from the parity cell array according to an inversion control signal generated by an inversion control circuit, so that a desired data pattern can be written to the parity cell array. This, as a result, can facilitate conducting a test of the parity cell array. In particular, a leakage test and the like between memory cells in the parity cell array can be easily conducted.

In a preferable example of the second aspect of the semiconductor memory of the present invention, the inversion circuits each have sub inversion circuits corresponding to all bits of the parity data, respectively. The inversion control circuit generates the inversion control signal for each of the sub inversion circuits. This makes it possible to invert each bit of the parity data separately, enabling write of a desired data pattern to the parity cell array.

In a preferable example of the second aspect of the semiconductor memory of the present invention, the inversion circuits each have sub inversion circuits corresponding to part of bits of the parity data, respectively. The inversion control circuit generates an inversion control signal common to the sub inversion circuits. A bit pattern of the parity data is determined according to a bit pattern of the regular data. Generally, several kinds of test patterns are used to test a cell array. This also applies to the parity cell array. A test pattern of the parity cell array can be generated by inverting the part of bits of the parity data generated according to predetermined regular data. Therefore, the operation of the inversion circuit can be controlled with the single inversion control signal, which allows a simplified configuration of the inversion control circuit. Further, since with one signal line, it is possible to transmit the inversion control signal, a wiring area of the signal line can be made small. As a result, chip size of the semiconductor memory can be reduced.

In a preferable example of the second aspect of the semiconductor memory of the present invention, a dummy sub inversion circuit is formed for the remaining bits except the part of bits of the parity data, and has the same circuit configuration as that of the sub inversion circuits. A terminal of the dummy sub inversion circuit receiving the inversion control signal is fixed to logic level that makes an inversion function ineffective. The sub inversion circuits and the dummy inversion circuit are formed irrespective of inverted bits and non-inverted bits, so that the same number of transistors can be disposed in transmission paths of all bit data. Consequently, it is possible to reduce timing skew among the bit data, allowing an increased timing margin. Switching (correction) between the inverted bits and the non-inverted bits is enabled only by changing connection destinations of the inversion control signal. Since the sub inversion circuits and the dummy inversion circuit can be regularly arranged, it is possible to prevent a characteristic change of the transistors due to a discontinuous pattern forming a circuit.

In a preferable example of the second aspect of the semiconductor memory of the present invention, the parity cell array has a plurality of memory cells and a plurality of word lines connected to the memory cells. The inversion control circuit sets logic level of the inversion control signal according to a selection address of the word line. Therefore, it is possible to write, for example, logic 1 to memory cells connected to one of the word lines adjacent to each other and write logic 0 to memory cells connected to the other. As a result, it is possible to test leakage occurring between memory cells arranged in line in a direction perpendicular to the word lines.

In a preferable example of the second aspect of the semiconductor memory of the present invention, each of the inversion circuits inverts both of read data and write data when the inversion control signal indicates effectiveness, while non-inverting both of the read data and the write data when the inversion control signal indicates ineffectiveness. This allows the parity generation circuit and the error correction circuit to normally function. That is, it is possible to conduct the test while the same circuit operation as a normal operation is performed with an error correction function being kept effective.

In a preferable example of the second aspect of the semiconductor memory of the present invention, the inversion control circuit generates the inversion control signal according to a pattern of test data read/written from/to the regular cell array. This makes it possible to write various test patterns to the parity cell array.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 11 is an explanatory chart showing an operation of the syndrome generation circuit shown in FIG. 10;

FIG. 16 is an explanatory chart showing an operation of the syndrome generation circuit shown in FIG. 15;

DESCRIPTION OF THE PREFERRED EMBODIMENTS

Figure 1:
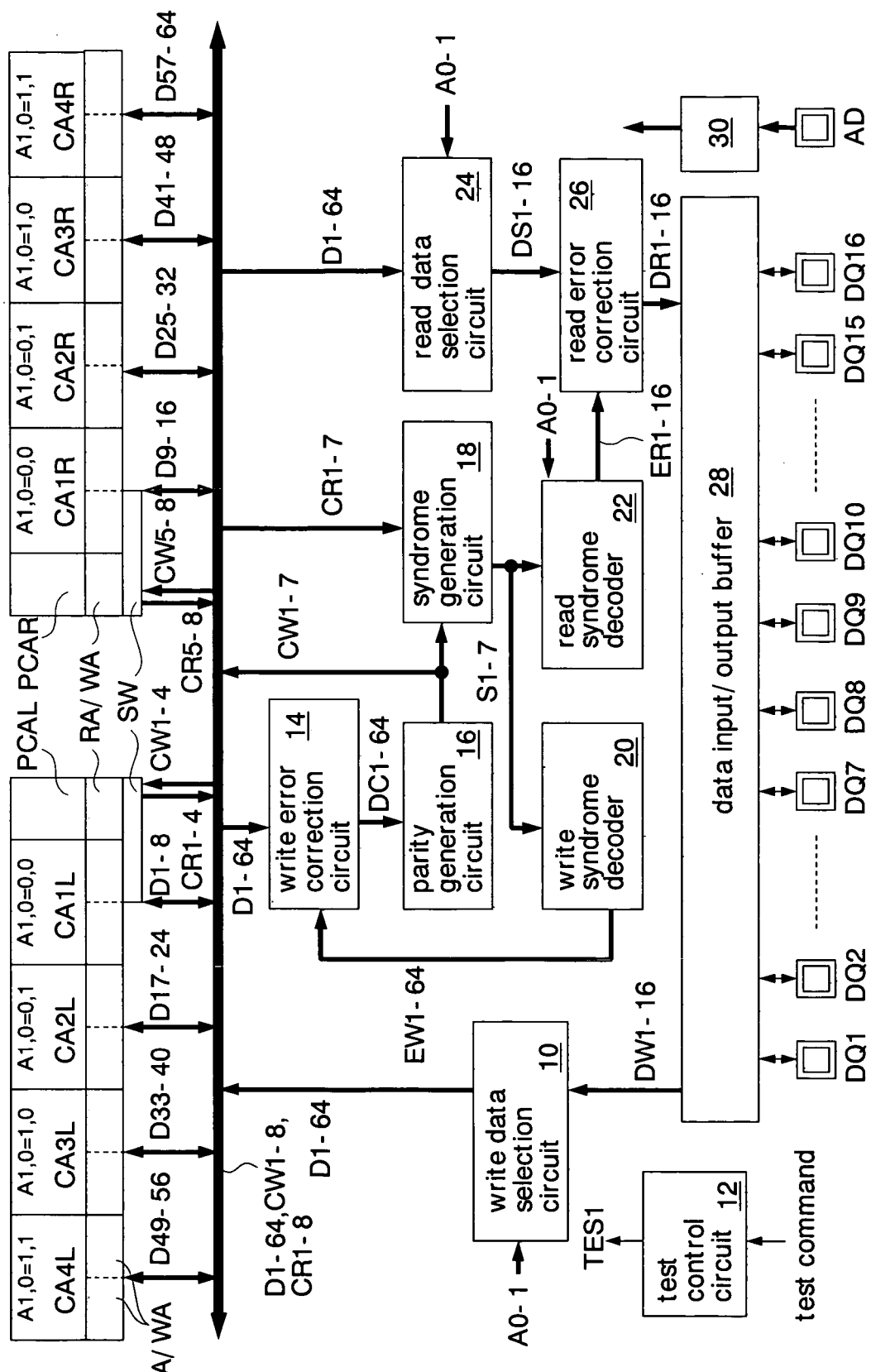
FIG. 1 is a block diagram showing a first embodiment of the semiconductor memory of the present invention.

Hereinafter, embodiments of the present invention will be described with reference to the drawings. The double squares in the drawings represent external terminals (pads). In the drawings, each signal line shown by the heavy line is constituted of a plurality of lines. Blocks to which the heavy lines are connected are partly constituted of a plurality of circuits. Signals supplied through the external terminals are denoted by the same reference codes as the terminal names. Further, each signal line through which a signal is transmitted is denoted by the same reference code as the signal name.

FIG. 1 shows a first embodiment of the semiconductor memory of the present invention. This semiconductor memory is formed as a pseudo SRAM on a silicon substrate by using a CMOS process. The pseudo SRAM has a memory core of a DRAM memory core and an SRAM interface.

The pseudo SRAM has regular cell arrays CA1 (CA1L, CA1R), CA2 (CA2L, CA2R), CA3 (CA3L, CA3R), CA4 (CA4L, CA4R) storing regular data supplied via external data terminals DQ1–16, parity cell arrays PCA (PCAL, PCAR) storing parity data, read amplifiers RA/write amplifiers WA, switch circuits SW, a write data selection circuit 10, a test control circuit 12, a write error correction circuit 14, a parity generation circuit 16, a syndrome generation circuit 18, a write syndrome decoder 20, a read syndrome decoder 22, a read data selection circuit 24, a read error correction circuit 26, a data input/output buffer 28, and an address buffer 30.

In addition to those shown in the drawing, the pseudo SRAM has an address decoder, command terminals and a command buffer receiving operation commands (write command, read command, a test command, and so on), a command decoder decoding the operation commands, an operation control circuit generating control signals for controlling a write operation, a read operation, and a refresh operation for the cell arrays CA1–4, PCA, and so on.

The regular cell arrays CA1L, CA2L, CA3L, CA4L shown on the left side of the drawing store data supplied to the external data terminals DQ1–8. The regular cell arrays CA1R, CA2R, CA3R, CA4R shown on the right side of the drawing store data supplied to the external data terminals DQ9–16. The external data terminals DQ1–16 are arranged in this order from the left as shown in the drawing. A bit width of data of each of the regular cell arrays CA1L–CA4L, CA1R–CA4R is 8 bits, and is equal to a bit width of the corresponding external data terminals DQ1–8 and a bit width of the corresponding external data terminals DQ9–16, respectively. The regular cell arrays CA1 (CA2–4) are laid out, being thus divided into the two regular cell arrays CA1L and CA1R (CA2L and CA2R, CA3L and CA3R, CA4L and CA4R) corresponding to the external data terminals DQ1–8 and 9–16, respectively, so that data lines can be wired in good order on a chip. The cell arrays will be detailed in later-described FIG. 2 to FIG. 4.

Write data supplied to the external data terminals DQ1–8 (low-order byte) are stored in one of the regular cell arrays CA1L–CA4L ending in "L" according to an address A1-0. Write data supplied to the external data terminals DQ9–16 (high-order byte) are stored in one of the regular cell arrays CA1R–CA4R ending in "R" according to the address A1-0.

In a normal operation mode, the regular cell arrays CA1 are accessed when two lowest-order bits (A1, A0) of the address are (0, 0). Similarly, the regular cell arrays CA2–4 are accessed when the address (A1, A0, ) is (0, 1), (1, 0), and (1, 1), respectively. Here, the normal operation mode is an operation mode in which a system (user) on which the pseudo SRAM is mounted accesses the pseudo SRAM. The write data supplied to the external data terminals DQ1–16 are written to one of the regular cell arrays CA1–4 selected according to the address A1-0 at each write operation. Further, out of 64-bit data read from the regular cell arrays CA1–4 at each read operation, 16 bits selected according to the address A1-0 are outputted to the external data terminals DQ1–16.

The parity cell arrays PCA store 7-bit parity bits (parity data) corresponding to the 64-bit data stored in the regular cell arrays CA1–4. Write parity data CW1–7 to be written to the parity cell arrays PCA are generated by the parity generation circuit 16. Read parity data CR1–7 read from the parity cell arrays PCA are outputted to the syndrome generation circuit 18. Low-order 4 bits (CW1–4 or CR1–4) out of the parity bits are stored in the parity cell array PCAL on the left side of the drawing. High-order 3 bits (CW5–7 or CR5–7) out of the parity bits are stored in the parity cell array PCAR on the right side of the drawing.

The number of the parity bits is 7, but in order to arrange the parity cell arrays PCA in the same layout as the layout of the regular cell arrays CA1–4, a bit width of the parity cell arrays PCA is designed to be 8 bits. Moreover, in consideration of easiness of a later-described test (evaluation), 8-bit signal lines are wired for allowing access to all the bits including the highest-order bit CW8 (CR8). In this embodiment, write parity data lines CW1–8 for input and read parity data lines CR1–8 for output are independently wired, but signal lines may be wired commonly for input and output.

Two blocks of the read amplifiers RA/write amplifiers WA are formed for each of the regular cell arrays CA1L–4L, CA1R–4R, and one block is formed for each of the parity cell arrays PCAL, PCAR. The switch circuits SW are formed in an area adjacent to the read amplifiers RA/write amplifiers WA of the regular cell array CA1L and the parity cell array PCAL and in an area adjacent to the read amplifiers RA/write amplifiers WA of the regular cell array CA1R and the parity cell array PCAR, respectively. In other words, each of the switch circuits SW is disposed between the data lines D1–8, CW1–4 (CR1–4) and the regular cell arrays CA1L/the parity cell array PCAL or between the data lines D9–12, CW5–8 (CR5–8) and the regular cell array CA1R/the parity cell array PCAR. The read amplifiers RA/write amplifiers WA will be detailed in later-described FIG. 2, and the switch circuits SW will be detailed in later-described FIG. 5 and FIG. 6.

In a write operation, the write data selection circuit 10 outputs write data DW1–16 supplied via the external data terminals DQ1-16 to the data lines D1–16, 17–32, 33–48, or 48–64, according to the address A1-0. The test control circuit 12 shifts the pseudo SRAM from the normal operation mode to a test mode in response to the test command supplied via the command terminal. The test control circuit 12 maintains a test signal TES1 at high level during the test mode and at low level during the normal operation mode.

In a read operation in response to the externally supplied read command, the write error correction circuit 14 outputs data D1–64, which are read from the regular cell arrays CA1–4, as they are as corrected data DC1–64. In a write operation in response to the externally supplied write command, the write error correction circuit 14 error-corrects the data D1–64 read from the regular cell arrays CA1–4, according to bit values of write error detection data EW1–64. The write error correction circuit 14 outputs to the parity generation circuit 16 the corrected bit data (one bit of the DC1–64) together with the other bit data (other uncorrected bits out of the DC1–64) supplied to the external data terminals DQ1–16. Note that the read of the data D1–64 from the regular cell arrays CA1–4 in the write operation is necessary for storing in the parity cell arrays PCA the parity data of the 64-bit data written to the regular cell arrays CA1–4.

Further, the write error correction circuit 14 has a latch circuit (not shown) holding read data including bit data specified by the write syndrome decoder 20. Therefore, it is not necessary to synchronize the timing of the write data supplied via the external data terminals DQ1–16 with the timing of the read data read from the regular cell arrays CA1–4 in response to a write request. Therefore, by using the write data and the read data held in the latch circuit, it is possible to surely generate the parity data. As a result, timing design can be facilitated. Further, timing specifications can be set as easily usable by a user. In addition, even when the write data to be written to the regular cell arrays CA1–4, respectively in the write operation are sequentially supplied to the external data terminals DQ1–16 (a burst write operation or the like), these data can be surely held by the latch circuit.

The parity generation circuit 16 generates the write parity data CW1–7 from the corrected data DC1–64. The syndrome generation circuit 18 calculates an exclusive-OR of the write parity data CW1–7 and the read parity data CR1–7 to generate syndromes S1–7. At the beginning of a write cycle that starts in response to the write request, the write syndrome decoder 20 specifies an erroneous bit according to the syndromes S1–7 so that the data D1–64 read from the regular cell arrays CA1–4 can be error-corrected. The write syndrome decoder 20 sets a bit (for example, EW1) of the write error detection data EW corresponding to the erroneous bit to logic level different from that of the other bits (for example, EW2–64).

In the read operation, the read syndrome decoder 22 judges whether or not the 16-bit read data to be outputted to the external data terminal DQ1–16 have a bit error, according to the syndrome S1–7 and the read address A1-0. Specifically, the read syndrome decoder 22 specifies the external data terminal DQ (one of the DQ1–16) corresponding to the erroneous bit data according to the syndromes S1–7 and the read address A1-0. The read syndrome decoder 22 sets a bit (for example, ER7) of the read error detection data ER corresponding to the erroneous bit data to logic level different from that of the other bits (for example, ER1–6, 8–16).

In the read operation, the read data selection circuit 24 outputs, as selection data DS1–16, 16 bits that are selected according to the address A1-0 out of the read data D1–64 read from the regular cell arrays CA1–4 so that these bits can be outputted to the external data terminals DQ1–16. The read error correction circuit 26 error-corrects bit data corresponding to the data terminal DQ (one of DQ1–16) specified by the read syndrome decoder 22. For the error correction, the read error correction circuit 26 inverts one bit of the selection data DS1–16 according to the read error detection data ER1–16 to output the corrected data as read data DR1–16.

In the write operation, the data input/output buffer 28 outputs data supplied to the external data terminals DQ1–16 as the write data DW1–16. In the read operation, the data input/output buffer 28 outputs the 16-bit read data DR1–16 to the external data terminals DQ1–16. The address buffer 30 receives an address for selection of a memory cell for data read/write via the address terminal AD. The address consists of a row address (high-order bits) for selection of a later-described row block RBLK and a word line WL in the row block RBLK and a column address (low-order bits) for selection of the regular cell arrays CA1–4 and bit lines BL, /BL in the cell arrays CA1–4.

Figure 2:
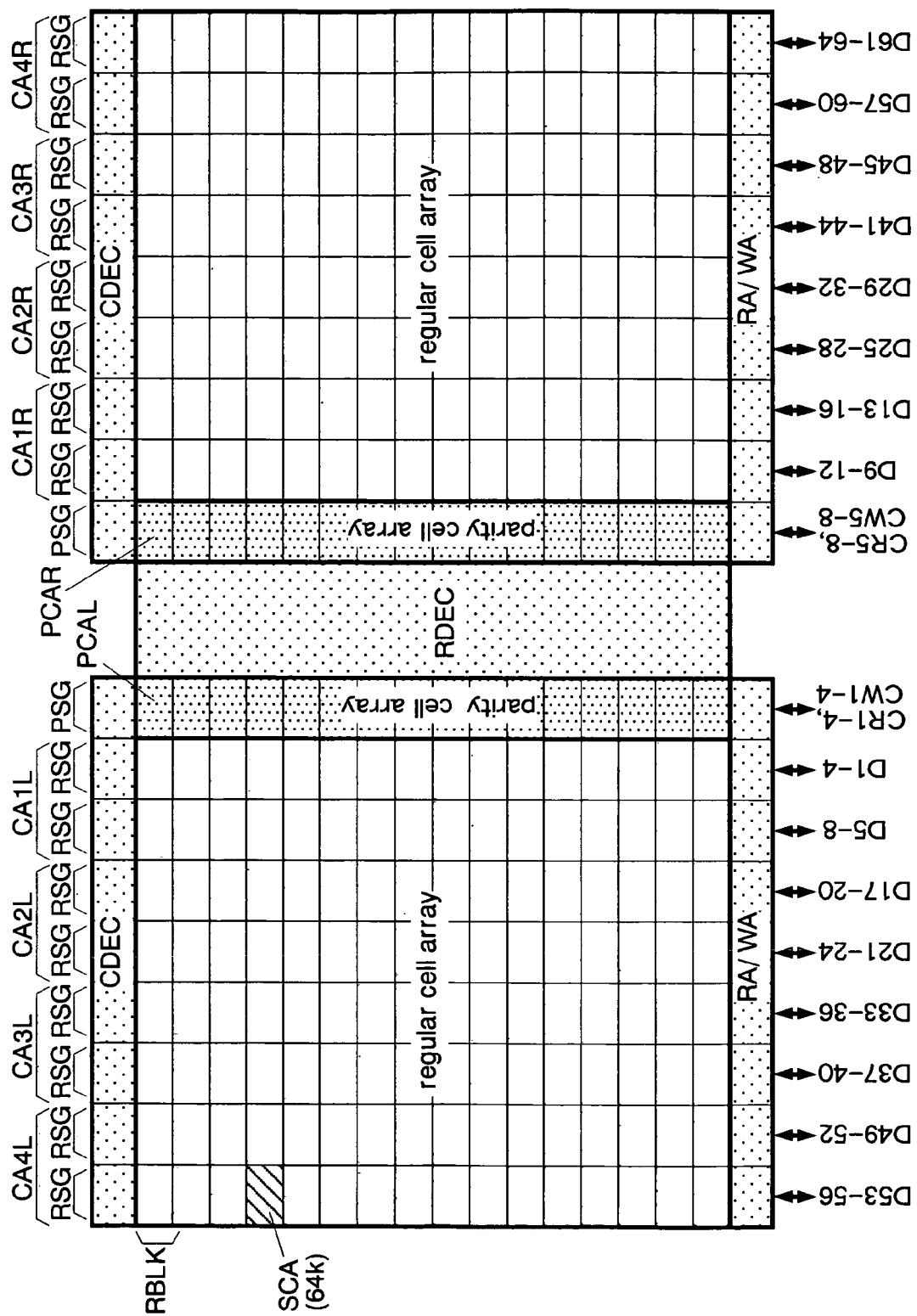
FIG. 2 is a block diagram showing the layout of regular cell arrays and parity cell arrays shown in FIG. 1.

FIG. 2 shows the layout of the regular cell arrays CA1–4 and the parity cell arrays PCA shown in FIG. 1. The total memory capacity of the regular cell arrays CA1–4 is 16 Mbits, and the memory capacity of the parity cell arrays PCA (PCAL, PCAR) is 2 Mbits. Each of the regular cell arrays CA1L–4L, CA1R–4R is constituted of two regular segments RSG each having 1-Mbit memory capacity. The parity cell array PCA is constituted of two parity segments PSG corresponding to the parity cell arrays PCAL, PCAR. That is, the pseudo SRAM has the 16 regular segments RSG for the regular cell arrays CA1–4 and the two parity segments PSG for the parity cell array PCA.

The 9-Mbit cell arrays CA1L–CA4L, PCAL arranged on the left side of the drawing and the 9-Mbit cell arrays CA1R–CA4R, PCAR arranged on the right side of the drawing are both divided into the 16 row blocks RBLK in a vertical direction of the drawing. In the read operation and the write operation, one of the row blocks RBLK is selected by a row block selection address (high-order 4 bits of the row address AD). In intersecting areas of the row blocks RBLK extending in the lateral direction of the drawing and the segments RSG, PSG extending in the vertical direction of the drawing, sub cell arrays SCA each having 64-kbit memory cells are formed (for example, the hatched area in the drawing).

In the drawing, column decoders CDEC and the read amplifiers RA/write amplifiers WA are respectively arranged on an upper side and a lower side of the cell arrays CA1L–CA4L, PCAL, PCAR, CA1R–CA4R. Row decoders RDEC are arranged between the cell arrays PCAL, PCAR. Each of the column decoders CDEC generates a column selection signal CSL (shown in FIG. 4) for selecting a bit line for data input/output in each of the segments RSG, PSG, according to the column address AD (low-order bit). The read amplifiers RA output read data amplified by later-described sense amplifiers SA shown in FIG. 4 to the data lines D1–64, CR1–8. The write amplifiers WA output the write data D1–64 and the parity write data CW1–8 to the sense amplifiers SA and the bit lines. According to the row address AD, each of the row decoders RDEC selects one of the row blocks RBLK and selects one of the 512 word lines WL0–512 (to be shown in later-described FIG. 4) in the selected row block RBLK.

Figure 3:
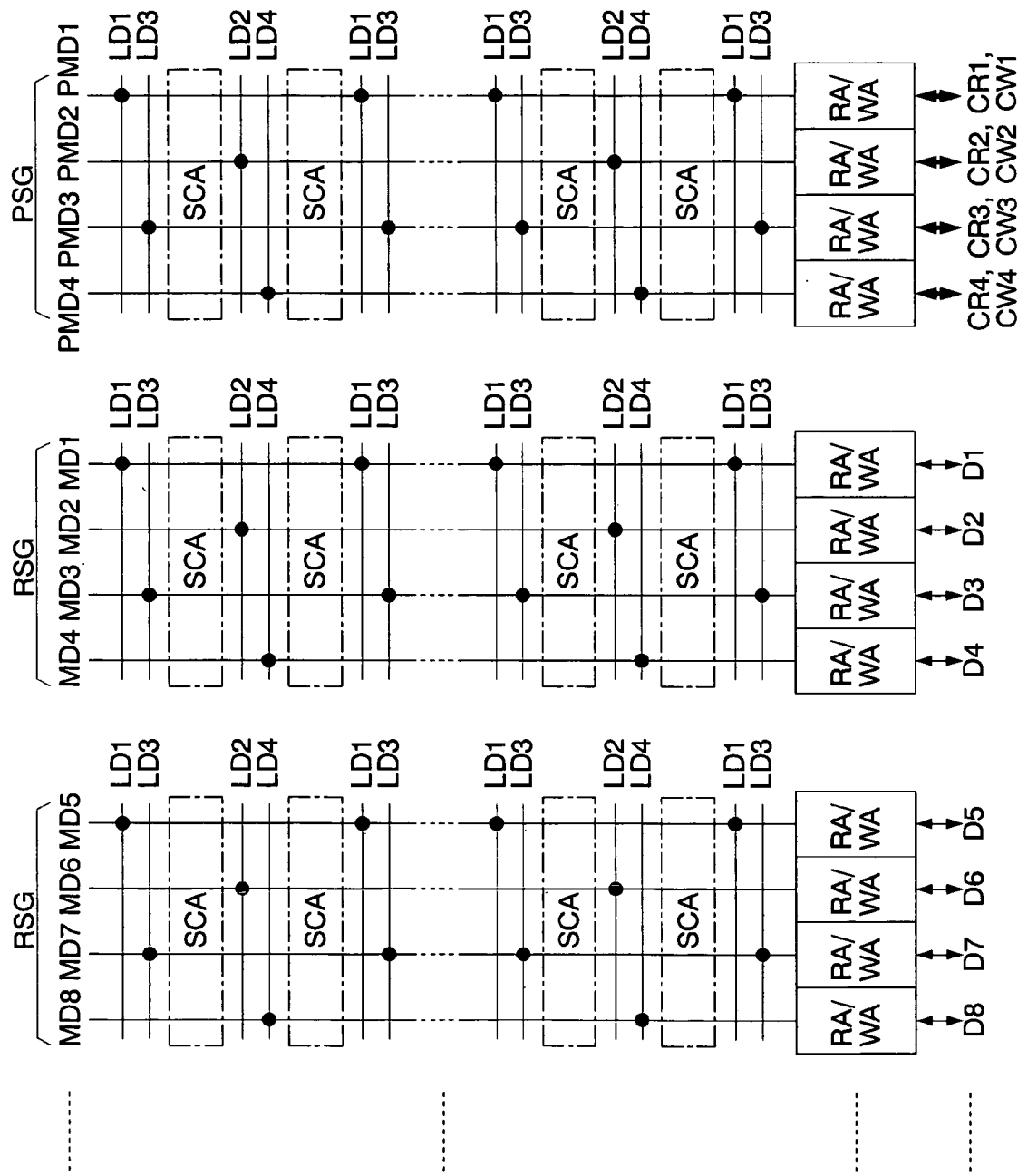
FIG. 3 is a block diagram showing details of segments shown in FIG. 2.

FIG. 3 shows details of the regular segments RSG and the parity segment PSG shown in FIG. 2. In this example, the segments RSG, PSG of the regular cell array CA1L and the parity cell array PCAL are shown. The segments RSG, PSG of the other cell arrays CA2L–4L, PCAR have the same structure as that in FIG. 3 except that the final numbers of main data lines MD and the data lines D are different. The segments RSG, PSG have the same circuits and layout.

The following description regarding FIG. 3 mainly describes the segment RSG corresponding to the data lines D1–4 and the segment PSG corresponding to the read parity data lines CR1–4 (the write data parity lines CW1–4).

Each of the segments RSG, PSG has a plurality of sets of local data lines LD1–4 wired in the lateral direction in the drawing along upper sides and lower sides of the sub cell arrays SA, the main data lines MD1–4 (or PMD1–4) each connected to the local data lines LD1–4, and four sets of the read amplifier RA/write amplifier WA corresponding to the main data lines MD1–4 (or PMD1–4). Each of the local data lines LD1–4 and the main data lines MD1–4, PMD1–4 may be constituted of a single line or may be constituted of complementary lines.

Each of the sub cell arrays SCA is connected to the local data lines LD1–4 adjacent thereto on its upper and lower sides via later-described column switches CSW shown in FIG. 4. In other words, the local data bus lines LD1, 3 and the local data lines LD2, 4 are shared by the sub cell arrays SCA adjacent thereto on an upper and a lower side. However, each of the uppermost and lowermost local data lines LD1, 3 is connected only to one sub cell array SCA adjacent thereto.

For example, in the read operation, a row of the sub cell arrays SCA arranged in the lateral direction of the drawing is selected according to the row address AD, and 4-bit read data are outputted from each of the selected sub cell arrays SCA to the local data lines LD1–4. The read data are transferred to the main data lines MD1–4 (or PMD1–4) via the local data lines LD1–4, and amounts of signals thereof are amplified by the read amplifiers RA. The 4-bit data are thus read from each of the sub cell arrays SCA. Therefore, 64-bit regular data and 8-bit parity data are read from the 16 sub cell arrays SCA constituting the regular cell arrays CA1–4 and the two sub cell arrays SCA constituting the parity cell arrays PCA by one read operation.

In the write operation, 64-bit data including write data supplied via the external data terminals DQ1-16 and the write parity data CW1–8 of this 64-bit data are written to the sub cell arrays SCA, 4 bits being written to each of the sub cell arrays SCA. Note that the highest-order bit CW8 of the write parity data is dummy data not used for the error correction and is fixed to logic 0 or logic 1.

Figure 4:
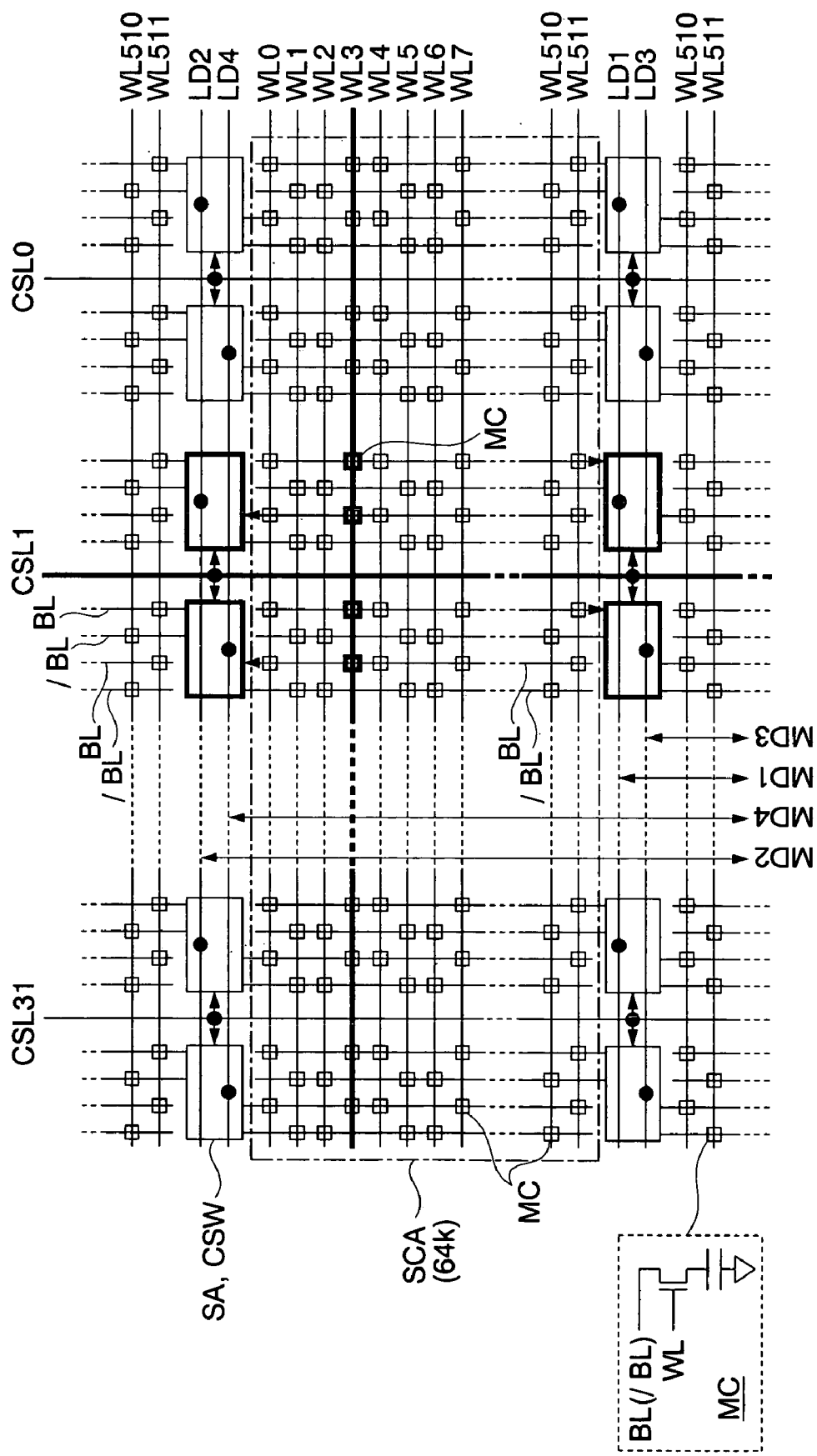
FIG. 4 is a block diagram showing details of a sub cell array shown in FIG. 3.

FIG. 4 shows details of the sub cell array SCA shown in FIG. 3. In this example, the sub cell array connected to the main data lines MD1–4 is shown, but the other sub cell arrays SCA also have the same structure as that shown in FIG. 4. The sub cell array SCA has the 512 word lines WL0–511 extending in the lateral direction of the drawing, the 256 bit lines (128 bit line pairs BL, /BL) extending in the vertical direction of the drawing, and the memory cells MC formed in respective intersections of the word lines WL and the bit lines BL (or /BL). The bit lines BL, /BL are alternately arranged. The memory cells MC are dynamic memory cells that are the same as memory cells of a DRAM. That is, each of the memory cells MC has a capacitor holding data as electric charge and a transfer transistor for connecting the capacitor to the bit line. The transfer transistor has a source and a drain one and the other of which are connected to the bit line BL (or /BL) and the capacitor, and a gate connected to the word line WL.

Each of the bit line pairs BL, /BL is connected to one of the local data lines LD1–4 via the column switch CSW (black circle in the drawing) formed on an upper side or a lower side of the sub cell array SCA. The column switches CSW are formed in areas in which the sense amplifiers SA are formed. The column switch CSW and the sense amplifier SA are shared by the two adjacent sub cell arrays SCA. A not-shown switch transistor (bit line transfer gate) connects the column switch CSW and the sense amplifier SA only to the sub cell array SCA selected according to the row address.

Column selection lines CSL (CSL0–31) are wired along the bit lines BL, /BL on the sub sell array SCA, one being provided per four bit line pairs BL, /BL. Each of the column selection lines CSL is connected to the corresponding four column switches CSW. In the write operation and the read operation, one of the column selection lines CSL0–31 changes from low level to high level according to a column address AD (a column line selection address) in order to turn on the four corresponding column switches CSW. Then, via the column switches CSW that are turned on, data are written to the four bit lines BL, /BL from the local data lines LD1–4 or data are read out to the local data lines LD1–4 from the four bit lines BL, /BL.

For example, when the word line WL3 and the column selection line CSL1 which are shown by the heavy lines in the drawing are selected in the read operation, data are read from the memory cells MC shown by the heavy lines in the drawing, and voltage differences between the bit lines BL, /BL are amplified by the sense amplifiers SA shown by the heavy-line frames. Note that for easier understanding of the description, the bit lines BL from which the data are read are shown by the arrows along the data flow. The amplified 4-bit read data are transferred to the local data lines LD1–4 via the four column switches CSW that are turned on in response to a high-level column selection line signal CSL1 and are further transferred to the main data lines MD1–4. Note that the main data lines MD1–4 connected in common to the plural sets of the local data lines LD1–4 are formed by using a wiring layer that is an upper layer of a wiring layer forming the bit lines BL, /BL and the local data lines LD1–4.

Figure 5:
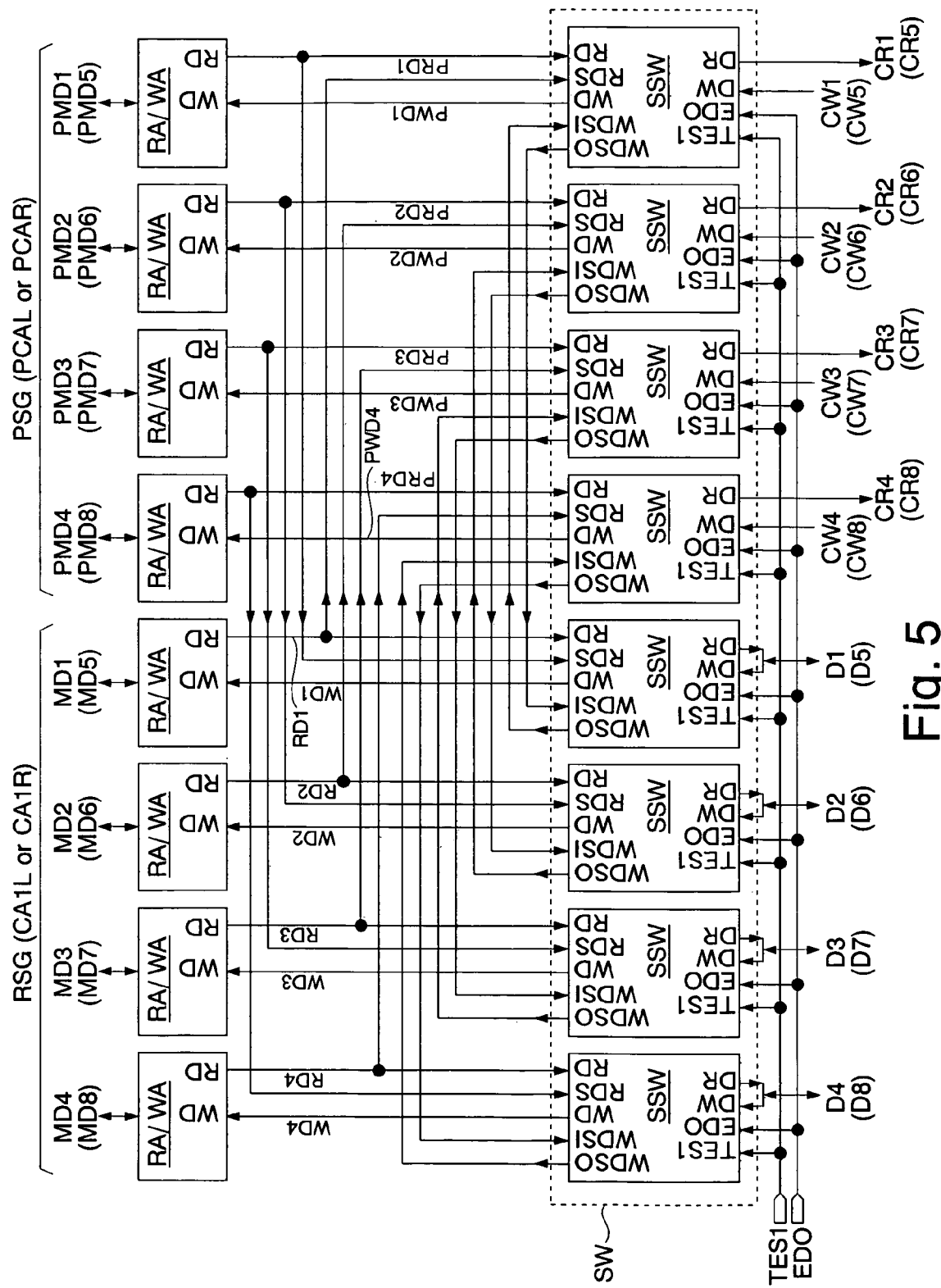
FIG. 5 is a block diagram showing details of a switch circuit shown in FIG. 1.

FIG. 5 shows details of the switch circuit SW shown in FIG. 1. FIG. 5 shows the switch circuit SW corresponding to the regular segment RSG on the parity cell array PCAL side out of the pair of regular segments RSG constituting the regular cell arrays CA1L and corresponding to the parity segment PSG constituting the parity cell array PCAL. Or, FIG. 5 shows the switch circuit SW corresponding to the regular segment RSG on the parity cell array PCAR side out of the pair of regular segments RSG constituting the regular cell array CA1R and corresponding to the parity segment PSG constituting the parity cell array PCAR, as shown by the data lines D5–8 in the parentheses. In the following description, the switch circuit SW corresponding to the cell arrays CA1L, PCAL will be described.

The switch circuit SW has eight sub switch circuits SSW corresponding to the data lines D1–4, CW1–4 (CR1–4). That is, one sub switch circuit SSW is formed per one bit of the regular data D1–4 and parity data CW1–4 (or CR1–4). Further, the two sub switch circuits SSW corresponding to the data lines D1/CW1 (CR1), D2/CW2 (CR2), D3/CW3 (CR3), or D4/CW4 (CR4) ending in the same number constitute each of the four sub switch pairs. The switch circuit SW is constituted of the plural sub switch circuits SSW, which can facilitate circuit designing and shorten the design period.

Each of the sub switch circuits SSW has terminals receiving the test signal TES1 and a data output enable signal EDO, a write data terminal DW receiving the write data (regular data, parity data) via the data lines D1–4, CW1–4, a read data terminal DR outputting the read data to the data lines D1–4, CR1–4, a write data output terminal WDSO outputting the write data to the other sub switch circuit SSW of the sub switch circuit pair, a write data input terminal WDSI receiving the write data from the other sub switch circuit SSW of the sub switch circuit pair, a write data terminal WD outputting the write data to the write amplifier WA, a read data terminal RDS commonly receiving the read data supplied to the other sub switch circuit SSW of the sub switch circuit pair, and a read data terminal RD receiving the read data from the read amplifier RA.

In the write operation in the normal operation mode during which the test signal TES1 is kept at low level, the sub switch circuits SSW receive at the write data terminals DW the write data (regular data and parity data) transmitted via the data lines D1–4, CW1–4. The sub switch circuits SSW output the received write data directly to the write data terminals WD. That is, in the normal operation mode, a switch function is made ineffective, and the regular data and the parity data are outputted to the write amplifiers WA corresponding to the main data lines MD1–4 and the write amplifiers WA corresponding to the main data lines PMD1–4, respectively.

In the read operation in the normal operation mode during which the test signal TES1 is kept at low level, the sub switch circuits SSW receive at the read data terminals RD the read data (the regular data and the parity data) supplied from the read amplifiers RA. The sub switch circuits SSW output the received read data directly to the data terminals DR. That is, in the normal operation mode, the switch function is made ineffective, and the regular data and the parity data are outputted to the data lines D1–4 and the read parity data lines CR1–4, respectively.

On the other hand, in the write operation in the test mode during which the test signal TES1 is kept at high level, the sub switch circuits SSW output the write data received at the write data terminals DW to the write data output terminals WDSO. That is, the write data are transmitted from the one-side sub switch circuits SSW of the sub switch circuit pairs to the other-side sub switch circuits SSW. Further, the sub switch circuits SSW receive the write data, which are outputted from the write data output terminals WDSO of the other-side sub switch circuits SSW of the sub switch circuit pairs, at the write data input terminals WDSI of the one-side sub switch circuits SSW. The sub switch circuits SSW output the received write data to the write data terminals WD. That is, in the test mode, the switch function is made effective, so that the regular data and the parity data are exchanged with each other by the switch circuit SW. The regular data and the parity data are outputted to the write amplifiers WA corresponding to the main data lines PMD1–4 and the write amplifiers WA corresponding to the main data lines MD1–4, respectively.

In the read operation in the test mode during which the test signal TES1 is kept at high level, the sub switch circuits SSW output the read data received at the read data terminals RDS to the read data terminals DR. That is, in the test mode, the switch function is made effective, so that the regular data and the parity data are exchanged with each other by the switch circuit SW. The regular data and the parity data are outputted to the read parity data lines CR1–4 and the data lines D1–4, respectively. The effectiveness/ineffectiveness of the switch circuit SW is thus changed according to the logic level of the test signal TES1, so that the switching by the switch circuit SW can be easily and surely controlled.

Figure 6:
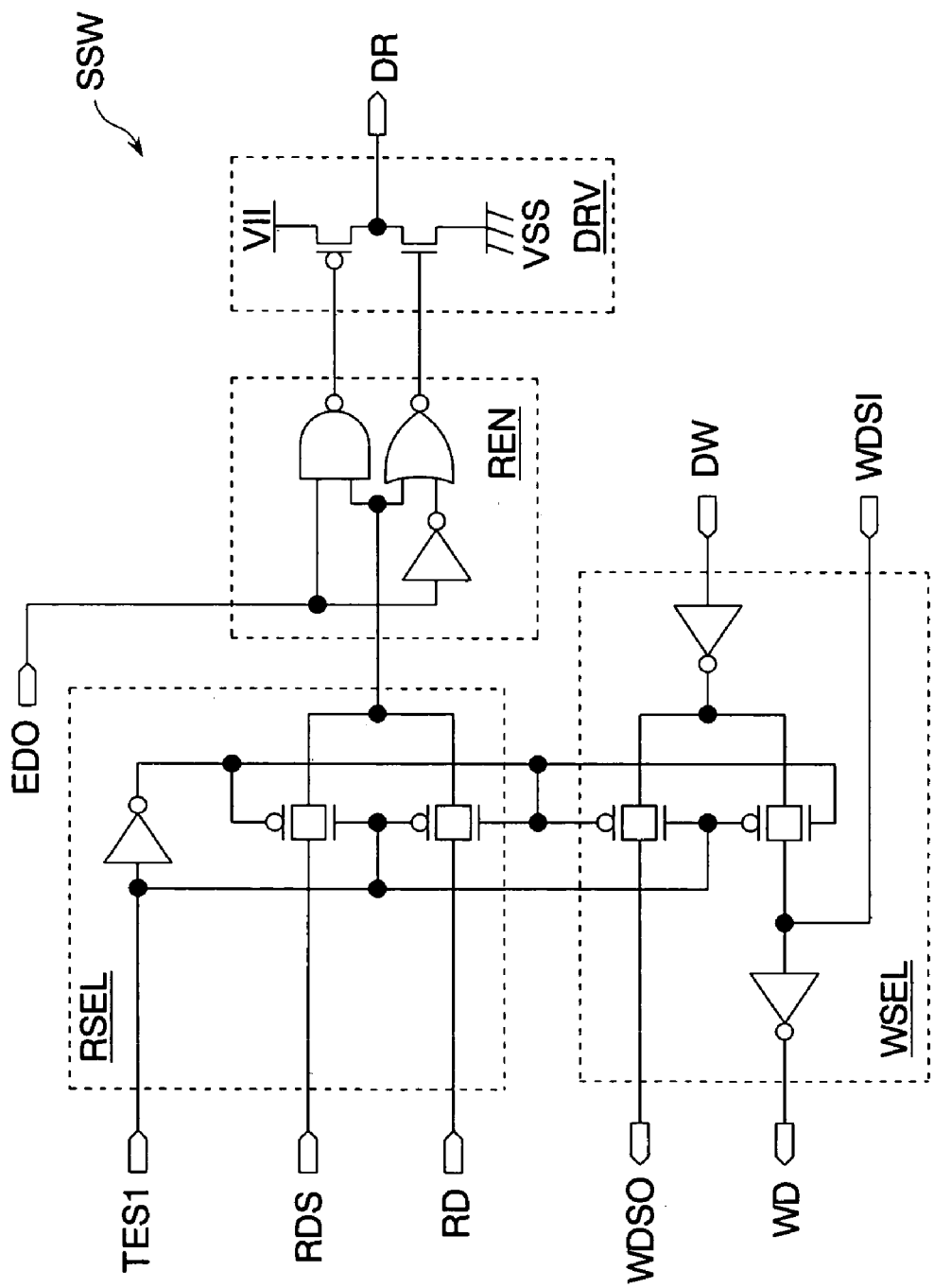
FIG. 6 is a circuit diagram showing details of a sub switch circuit shown in FIG. 5.

FIG. 6 shows details of the sub switch circuit SSW shown in FIG. 5. The sub switch circuit SSW has a read selector RSEL, a write selector WSEL, a read enable circuit REN, and a driver circuit DRV (output buffer). The read selector RSEL has a pair of CMOS transmission gates. One of the CMOS transmission gates (the upper side in the drawing) is kept ON during a high-level period of the test signal TES1, in order to output the read data received at the read data terminal RDS to the read enable circuit REN. The other CMOS transmission gate (the lower side in the drawing) is kept ON during a low-level period of the test signal TES1, in order to output the read data received at the read data terminal RD to the read enable circuit REN. That is, each of the read selectors RSEL corresponding to the regular cell array CA1L (or CA1R) outputs the read data from the read amplifier RA of either the regular cell array CA1L (or CA1R) or the parity cell array PCAL (or PCAR) to the data lines D1–4 (or D5–8).

Each of the read selectors RSEL corresponding to the parity cell array PCAL (or PCAR) outputs, to the read parity data lines CR1–4 (or CR5–8), the read data from the read amplifier RA of either the regular cell array CA1L (or CA1R) or the parity cell array PCAL (or PCAR).

The write selector WSEL has a pair of CMOS transmission gates and a driver circuit (CMOS inverter) outputting the write data to the write data terminal WD. One of the CMOS transmission gates (the upper side in the drawing) is kept ON during a high-level period of the test signal TES1 in order to output the write data received at the write data terminal DW, to the data output terminal WDSO. At this time, the write data received at the write data input terminal WDSI is outputted to the write data terminal WD. The other CMOS transmission gate (the lower side in the drawing) is kept ON during a low-level period of the test signal TES1 in order to output the write data received at the write data terminal DW, to the write data terminal WD. At this time, one of the CMOS transmission gates is OFF, so that the write data output terminal WDSO is brought into a high-impedance state. That is, the write selectors WSEL corresponding to the regular cell array CA1L (or CA1R) output the write data D1–4 (or D5–8) to the write amplifiers WA of either the regular cell array CA1L (or CA1R) or the parity cell array PCAL (or PCAR). The write selectors WSEL corresponding to the parity cell array PCAL (or PCAR) output the write parity data CW1–4 (or CW5–8) to the write amplifiers WA of either the regular cell array CA1L (or CA1R) or the parity cell array PCAL (or PCAR).

In the read operation (the data output enable signal EDO=high level), the read enable circuit REN outputs logic level that is inverted logic level of the read data supplied from the read selector RSEL, to a NAND gate and a NOR gate. During a period except the read operation period (the data output enable signal EDO=low level), the read enable circuit REN sets outputs of the NAND gate and the NOR gate to high level and low level, respectively.

The driver circuit DRV has a pMOS transistor and an nMOS transistor connected in series between a power supply line VII and a ground line VSS. In the read operation, the driver circuit DRV outputs to the read data terminal DR the read data supplied from the read selector RSEL. During a period except the read operation period, the driver circuit DRV keeps the pMOS transistor and the nMOS transistor OFF according to the control by the read enable circuit REN, to set the read data terminal DR to a floating state.

Figure 7:
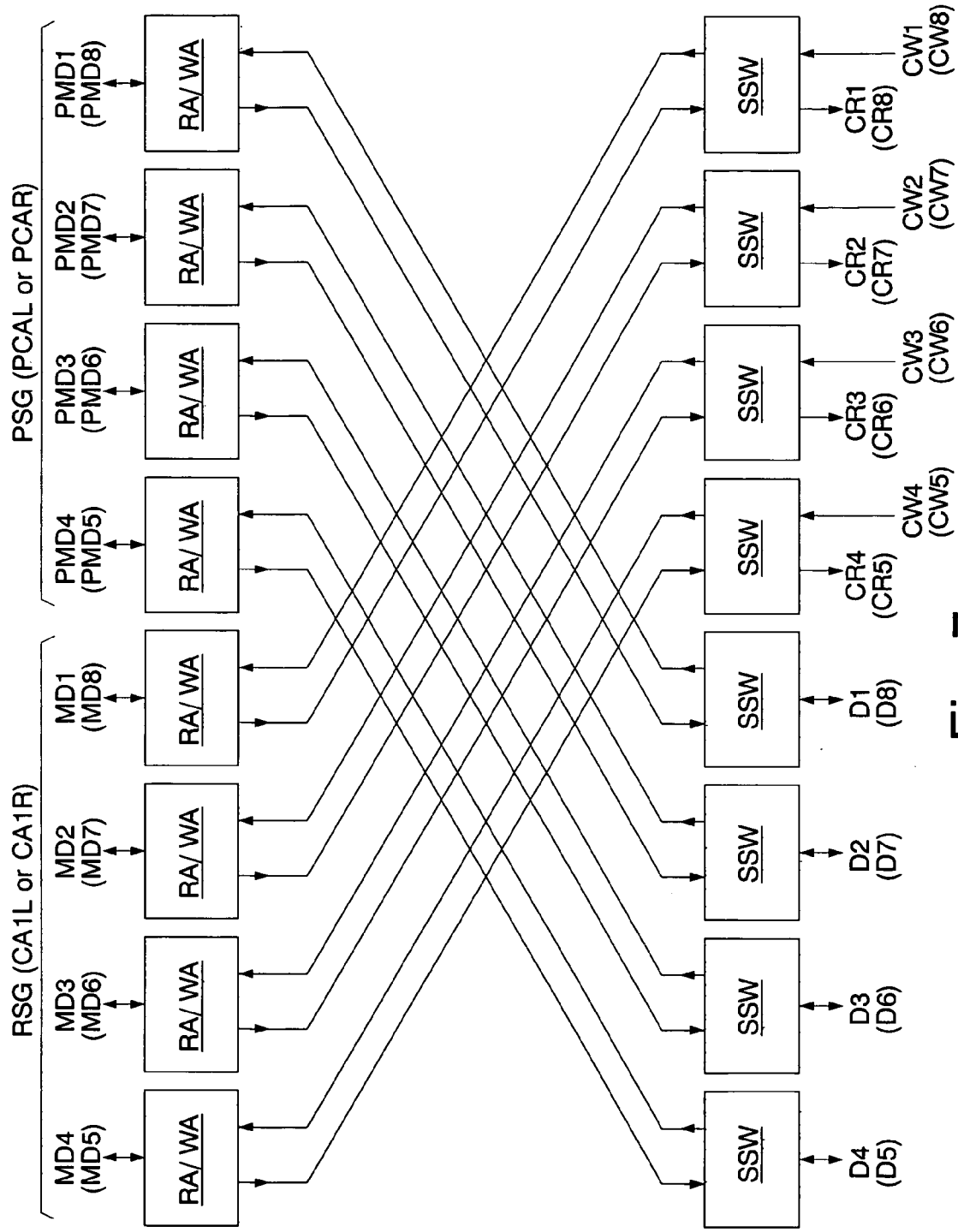
FIG. 7 is an explanatory chart showing an overview of an operation of the switch circuit in a test mode.

FIG. 7 shows an overview of an operation of the switch circuit SW in the test mode.

In the test mode, the sub switch circuits SSW corresponding to the regular cell array CA1L (or CA1R; the same hereinafter) output the write data D1–4 (or D5–8; the same hereinafter) to the write amplifiers WA of the parity cell array PCAL (or PCAR; the same hereinafter) and output the read data from the parity cell array PCAL to the data lines D1–4. Similarly, in the test mode, the sub switch circuits SSW corresponding to the parity cell array PCAL output the write parity data CW1–4 (or CW5–8; the same hereinafter) to the write amplifiers WA of the regular cell array CA1L and output the read data from the regular cell array CA1L to the read parity data lines CR1–4. FIG. 7 shows that the regular data and the parity data are thus exchanged with each other in the test mode. Therefore, it is possible to supply data to be written to the parity cell arrays PCA via the external data terminals DQ1–16 and output read data from the parity cell arrays PCA to the external data terminal DQ1–16. In other words, desired data can be written to the parity cell arrays PCA, which can facilitate conducting a test of the parity cell arrays. In particular, a leakage test or the like between memory cells, which has been conventionally difficult, can be easily conducted. The test can be conducted while the parity generation circuit 16 and the error correction circuits 14, 26 are in operation. This means that the test can be conducted in parallel to the execution of the same circuit operation as the normal operation.

Figure 8:
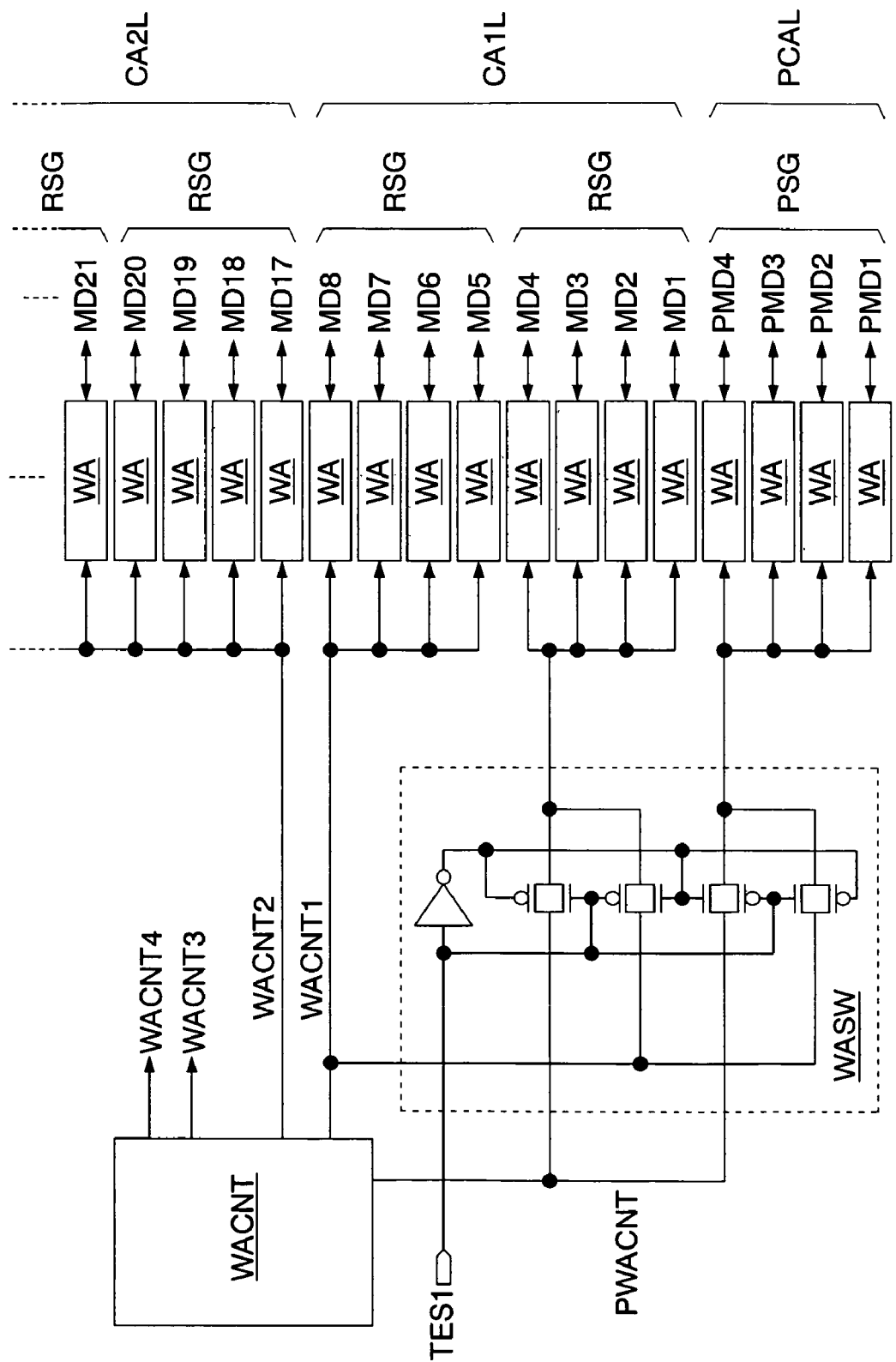
FIG. 8 is a block diagram showing a write amplifier control circuit and a write amplifier switch circuit.

FIG. 8 shows a write amplifier control circuit WACNT that generates write amplifier control signals for controlling operations of the write amplifiers WA, and a write amplifier switch circuit that exchanges the write amplifier control signals with each other. The write amplifier control circuit WACNT, which is formed in, for example, an operation control circuit (not shown), generates regular write amplifier control signals WACNT1–4 and a parity write amplifier control signal PWACNT in sequence in timing with the supply of the write data to the external data terminals DQ. The regular write amplifier control signals WACNT1–4 control operations of the write amplifiers WA of the regular cell arrays CA1–4. The parity write amplifier control signal PWACNT controls operations of the write amplifiers WA of the parity cell arrays PCA.

The write amplifier switch circuit WASW has four CMOS transmission gates. Two of the CMOS transmission gates are ON in the normal operation mode (TES1=low level) and the other two CMOS transmission gates are ON in the test mode (TES1=high level). In the normal operation mode, the write amplifier switch circuit WASW outputs the write amplifier control signal WACNT1 to the write amplifiers WA of the regular segment RSG arranged on the parity cell array PCAL side in the regular cell array CA1, and outputs the write amplifier control signal PWACNT to the write amplifiers WA of the parity cell array PCAL. In the test mode, the write amplifier switch circuit WASW outputs the write amplifier control signal WACNT1 to the write amplifiers WA of the parity cell array PCAL, and outputs the write amplifier control signal PWACNT to the write amplifiers WA of the regular segment RSG disposed on the parity cell array PCAL side in the regular cell array CA1. This means that in the test mode, the regular write amplifier control signal WACNT1 and the parity write amplifier control signal PWACNT are exchanged with each other.

The pseudo SRAM of the present invention has a burst write operation function and a burst read operation function. The burst write operation function is a function of converting the series write data DW1-16 successively supplied to the external data terminals DQ1–16 to the parallel write data D1–64 and writing the converted write data D1–64 simultaneously to the regular cell arrays CA1–4. At this time, the parity data CW1–7 generated from the write data D1–64 are written to the parity cell arrays PCA in synchronization with the write to the regular cell arrays CA1–4. The burst read operation function is a function of converting the parallel read data D1–64 read simultaneously from the regular cell arrays CA1–4 and the parity cell arrays PCA to the series read data DQ1–16 and sequentially outputting the converted read data DQ1–16 to the external data terminals DQ1–16. At this time, in order to error-correct the read data D1–64, the parity data CR1–7 are read from the parity cell arrays PCA in synchronization with the read from the regular cell arrays CA1–4.

The number of data inputted/outputted to/from the external data terminals DQ1–16 is set in advance as a burst length in a mode register or the like of the pseudo SRAM. The following describes an example where the burst length is set to "4". For example, when (A1, A)=(0, 0) is set as a start address of the burst write operation, the write data to the regular cell arrays CA1, CA2, CA3, CA4 are received in this order by the external data terminal DQ1–16. Specifically, the write data DW1–16 supplied first are transferred to the data lines D1–16, and the write data DW1–16 supplied second and thereafter are sequentially transferred to the data lines D17–32, D33–48, D49–64. Each of the write amplifiers WA starts its operation to latch the write data in synchronization with the transfer of the write data to the corresponding data line (any 16 bits of D1–64). The supply of the 64-bit data to be written to the regular cell arrays CA1–4 in this burst write operation is completed when the final data DW1–16 (corresponding to D49–64) are supplied. Therefore, the write amplifiers WA of the parity cell arrays PCA start their operations after the parity data CW1–7 of the 64-bit data including the final data D49–64 are generated, to latch the parity data CW1–7. Therefore, in this example, the write amplifier control circuit WACNT activates the write amplifier control signals WACNT1–4, PWACNT in sequence.

On the other hand, when (A1, A0, )=(0,1) is set as the start address of the burst write operation, data to the regular cell arrays CA2, CA3, CA4, CA1 are received in this order by the external data terminals DQ1–16. Specifically, the write data DW1–16 first supplied are transferred to the data lines D17–32, and the write data DW1–16 supplied second and thereafter are transferred to the data lines D33–48, D49–64, D1–16 in sequence. In this case, the burst write operation is divided into a first write operation for the data D17–64 and a second write operation for the final data D1–16. In the first write operation, the 64-bit data D1–64 including the data D1–16 read from the regular cell arrays CA1 are written to the regular cell arrays CA1–4. In the second write operation, the 64-bit data D1–64 including the data D17–64 read from the regular cell arrays CA2–4 are written to the regular cell arrays CA1–4.

In the first write operation, the data D1–16 pre-read from the regular cell array CA1 are latched in the write amplifiers WA. The 64-bit data to be written to the regular cell arrays CA1–4 are completed when the third data DW1–16 (corresponding to D49–64) are supplied. Therefore, the write amplifiers WA of the parity cell arrays PCA start their operations after the parity data CW1–7 of the 64-bit data including the third data D49–64 are generated, to latch the parity data CW1–7. Therefore, in this example, the write amplifier control circuit WACNT activates the write amplifier control signals WACNT1, WACNT2–4, PWACNT in sequence.

In the second write operation, the pre-read data D17–64 from the regular cell arrays CA2–4 are latched by the corresponding write amplifiers WA, respectively. The 64-bit data to be written to the regular cell arrays CA1–4 are completed when the final data DW1–16 (corresponding to D1–16) are supplied. Therefore, after the parity data CW1–7 of the 64-bit data including the final data D1–16 are generated, the write amplifiers WA of the parity cell arrays PCA start their operations to latch the parity data CW1–7. Therefore, in this example, the write amplifier control circuit WACNT activates the write amplifier control signals WACNT2–4, WACNT1, PWACNT in sequence.

Incidentally, in the test mode, the write data D1–8 are written to the parity cell array PCAL, and the parity data CW1–7 are written to the regular cell array CA1L. Therefore, the operation order of the write amplifiers WA of the cell arrays CA1L, PCAL has to be changed. This change is caused by the aforesaid write amplifier switch circuit WASW. By exchanging the write amplifier control signals WACNT1, PWACNT for each other in the test mode, it is possible to operate the write amplifiers WA in accurate timing with the supply of the corresponding write data. Therefore, it is possible to prevent erroneous latch by the write amplifiers WA and prevent the malfunction of the pseudo SRAM. Further, the operations of the write amplifier switch circuit WASW are switched according to the logic level of the test signal TES1, which makes it possible to control the switching by the write amplifier switch circuit WASW with ease and with reliability.

In the first embodiment described above, the switch circuit SW exchanges the regular data and the parity data with each other, which allows the write of desired data to the parity cell arrays PCA, facilitating conducting the test of the parity cell arrays PCA. The test can be conducted while the parity generation circuit 16 and the error correction circuits 14, 26 are in operation as in the normal operation. Constituting the switch circuit SW of the plural sub switch circuits SSW can facilitate circuit designing and shorten the design period. Owing to the write amplifier switch circuit WASW, it is possible to operate the write amplifiers WA in accurate timing with the supply of the write data supplied to the write amplifiers and thus prevent the malfunction of the pseudo SRAM. The switching by the write amplifier switch circuit WASW can be easily and surely executed.

Figure 9:
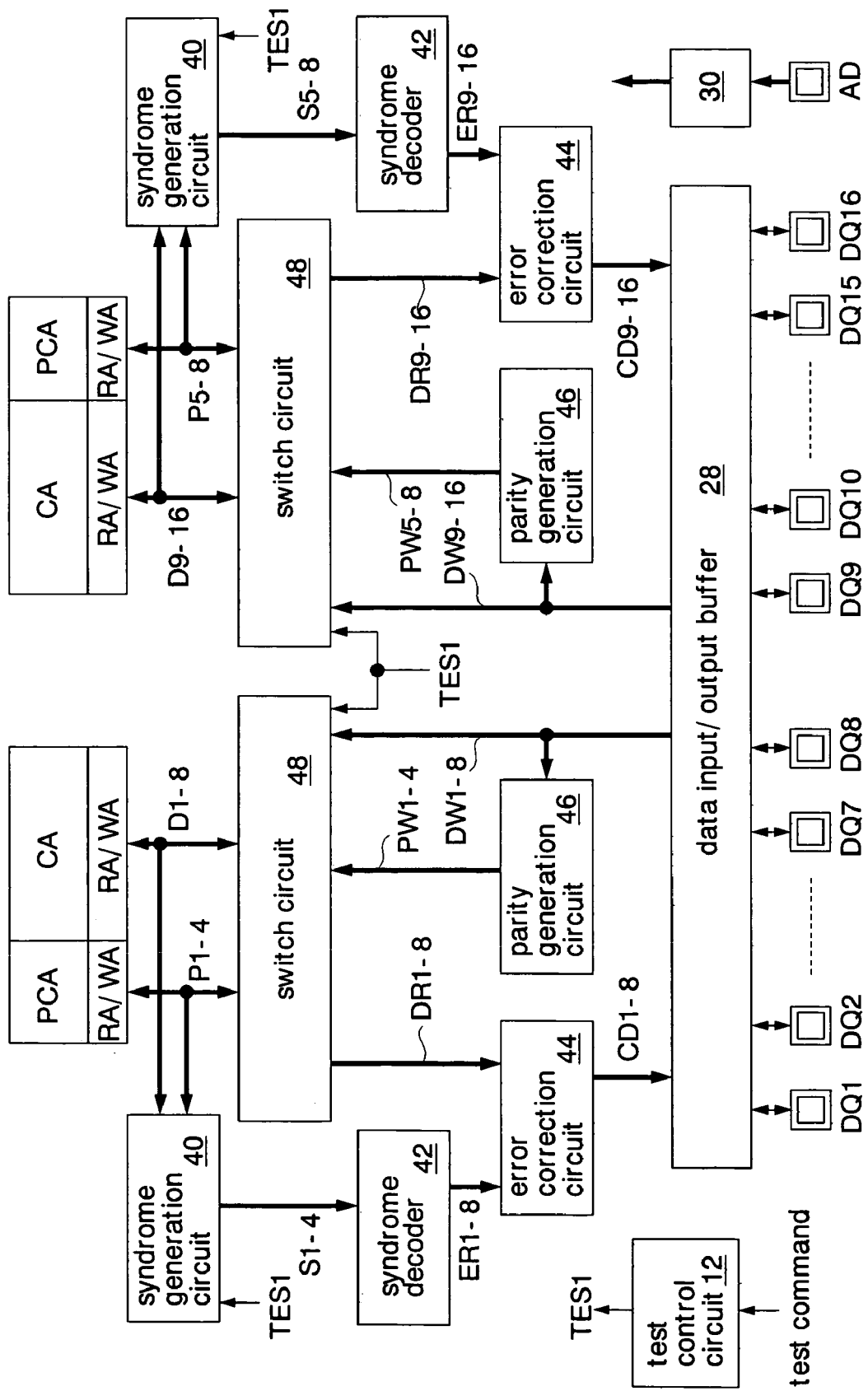
FIG. 9 is a block diagram showing a second embodiment of the semiconductor memory of the present invention.

FIG. 9 shows a second embodiment of the semiconductor memory of the present invention. This semiconductor memory is formed as a pseudo SRAM on a silicon substrate by using a CMOS process. The same reference codes are used to designate the same elements as the elements described in the first embodiment and detailed description thereof will be omitted.

The pseudo SRAM has a test control circuit 12, a data input/output buffer 28, an address buffer 30, a regular cell array CA and a parity cell array PCA which correspond to external data terminals DQ1–8, and a regular cell array CA and a parity cell array PCA which correspond to external data terminals DQ9–16. The pseudo SRAM further has, for each set of the cell arrays CA, PCA, a syndrome generation circuit 40, a syndrome decoder 42, an error correction circuit 44, a parity generation circuit 46, and a switch circuit 48.

The regular cell array CA, the parity cell array PCA, the syndrome generation circuit 40, the syndrome decoder 42, the error correction circuit 44, the parity generation circuit 46, and the switch circuit 48, which correspond to the external data terminals DQ1–8, and those corresponding to the external data terminals DQ9–16 have the same structures except that the bit numbers of corresponding data are different, and operate synchronously. Therefore, only the circuits corresponding to the external data terminals DQ1–8 will be described below.

The regular cell array CA stores data DQ1–8 supplied to the external data terminals DQ1–8. The parity cell array PCA stores parity data of the data DQ1–8. The syndrome generation circuit 40 generates syndromes S1–4 according to regular data D1–8 and parity data P1–4 read from the cell arrays CA, PCA. The syndromes S1–4 are generated in order to notify the error correction circuit 44 of an erroneous bit in the read data. In a normal operation mode and a test mode (test signal TES1=high level), the syndrome generation circuit 40 exchanges one bit of input data. Details of the syndrome generation circuit 40 will be described in FIG. 10 to FIG. 13 to follow.

The data lines D1–8, P1–4 transmitting the regular data D1–8 and the parity data P1–4 are wired between the cell arrays CA, PCA and the switch circuit 48. This means that the data D1–8, P1–4 supplied to the syndrome generation circuit 40 are data before passing through the switch circuit 48. In this embodiment, a critical path for outputting the read data in a read operation is a path passing through the syndrome generation circuit 40, the syndrome decoder 42, and the error correction circuit 44. Since the switch circuit 48 is not included in the critical path, the number of delay elements in the critical path can be smaller, which can shorten the read access time.

According to the syndromes S1–4, the syndrome decoder 42 judges whether or not 8-bit read data to be outputted to the external data terminals DQ1–8 have an erroneous bit. The syndrome decoder 42 sets a bit (for example, ER7) of read error detection data ER corresponding to erroneous bit data to logic level different from that of the other bits (for example, ER1–6, 8). The error correction circuit 44 inverts one bit of read data DR1–8 according to the read error detection data ER1–8 for error correction and outputs the inverted data as corrected data CD1–8. The parity generation circuit 46 generates parity data PW1–4 from write data DW1–8 supplied from the external data terminals DQ1–8.

The switch circuit 48 has the same circuit configuration as the switch circuit SW (FIG. 5) of the first embodiment. In this embodiment, however, since write data signal lines DW1–16 and read data signal lines DR1–16 are wired independently from each other, a data output enable signal EDO is fixed to high level. In a write operation in a normal operation mode (test signal TES1=low level), the switch circuit 48 outputs the write data DW1–8 supplied from the external data terminals DQ1–8 to the regular data lines D1–8 and outputs the parity data PW1–16 to the parity data lines P1–4. In a read operation in the normal operation mode, the switch circuit 48 outputs the data D1–8, which are read from the regular cell array CA, as read data DR1–8 to the error correction circuit 44.

In a write operation in a test mode (test signal TES1=high level), the switch circuit 48 outputs the parity data P1–4 and the write data DW5–8 to the regular data lines D1–8, and outputs the write data DW1–4 to the parity data lines P1–4. In a read operation in the test mode, the switch circuit 48 outputs the parity data P1–4 and the data D5–8, which are read from the parity cell array PCA and the regular cell array CA, respectively, to the error correction circuit 44 as the read data DR1–8. This means that the switch circuit 48 exchanges the regular data D1–4 and the parity data P1–4 with each other in the test mode.

Figure 10:
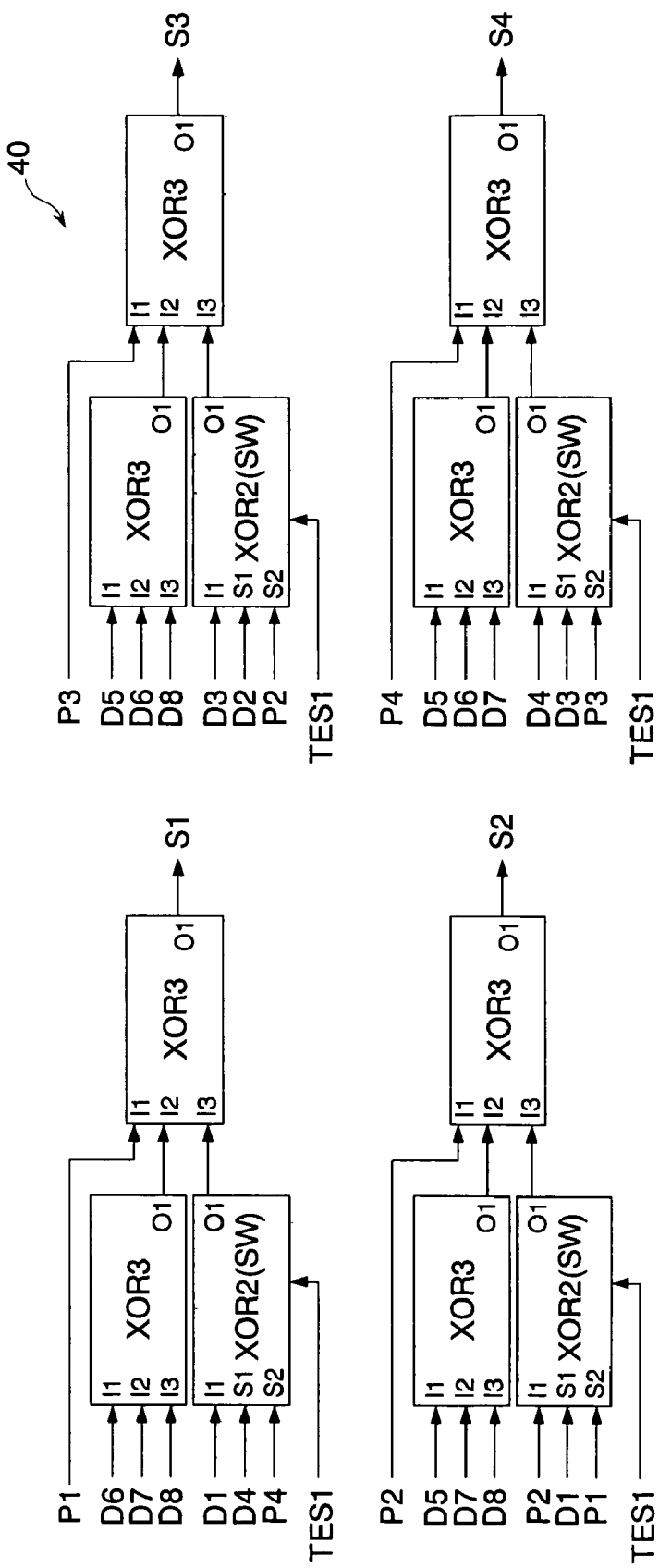
FIG. 10 is a bock diagram showing details of a syndrome generation circuit shown in FIG. 9.

FIG. 10 shows details of the syndrome generation circuit 40 shown in FIG. 9. The syndrome generation circuit 40 is constituted of four circuit blocks for generating 4-bit syndrome values S1–4. Each of the blocks has a 2-input exclusive-OR circuit XOR2 (SW) having a switch function (switch part) and two 3-input exclusive-OR circuits XOR3. The exclusive-OR circuit XOR2 (SW) uses, for logical operation, a data signal supplied to an input terminal S1 while receiving the test signal TES1 at low level, and uses, for logical operation, a data signal supplied to an input terminal S2 while receiving the test signal TES1 at high level. In short, the exclusive-OR circuit XOR2 (SW) changes the data signals used for the logical operation according to an operation mode.

For example, the block generating the syndrome value S1 receives the data P1, D6–8, D1, D4 in the normal operation mode, while receiving the data D1, D6–8, P1, P4 in the test mode. Focusing on data after the exchange of the aforesaid exclusive-OR circuit XOR2 (SW), the block generating the syndrome value S1 calculates an exclusive-OR of the data P1, D6–8, D1, D4 in the normal operation mode, while calculating an exclusive-OR of the data P1, D6–8, D1, P4 in the test mode. Therefore, the syndrome value S1 in the test mode can be generated only by exchanging the data D4 for the data P4 in the syndrome value S1 in the normal operation. The same applies to the other blocks.

FIG. 11 shows an operation of the syndrome generation circuit 40 shown in FIG. 10.

The parity generation circuit 46 generates each of the parity data P1–4 by using 5-bit data marked with circles in the drawing. To be in more detail, in constituting each of the parity data P1–4 (ECC code), two regular data including regular data ending in the same number out of the regular data D1–4 and three regular data out of regular data D5–8 are assigned.

Each of the syndromes S1–4 is generated by calculating an exclusive-OR of the 5-bit data in the drawing and corresponding parity data (one of P1–4). The sign "^" shown in the drawing represents an arithmetic symbol for the exclusive-OR. Each of the arithmetic expressions expressing the logic of the syndrome generation circuit 40 corresponds to the logic of each of the circuit blocks shown in FIG. 10. This embodiment is characterized in that each of the arithmetic expressions includes both the regular data and the parity data exchanged by the switch circuit 48 (for example, D1 and P1 in the arithmetic expression of the syndrome value S1).

In the arithmetic expressions of the respective syndromes S1–4 in the test mode (test signal TES1=high level (H)), the right sides represent data actually inputted to the circuit blocks, out of the data D1–8, P1–4. In the test mode, bits D1–4 of the regular cell array CA store the parity data P1–4, and bits P1–4 of the parity cell array PCA store the regular data D1–4. Therefore, the 3-bit data underlined in each of the expressions are data where the regular data and the parity data are exchanged with each other, in comparison with the arithmetic expressions in the normal operation mode (test signal TES1=low level (L)).

The 2-bit data (for example, P1 and D1) out of the three-bit data underlined in the expression except the circled bit data have the same final number. These 2-bit data are constantly inputted to the circuit block regardless of the operation mode. Therefore, these 2-bit data need not be exchanged with each other in the normal operation mode and the test mode. In the syndrome generation circuit 40, the number of bits to be exchanged is decreased, so that circuit scale of the switch part for data exchange can be reduced.

On the other hand, the circled bit data is data where the regular data is exchanged with the parity data by the switch circuit 48. This data is switched back to the original bit of the regular data by the switching function (switch part) of the exclusive-OR circuit XOR2 (SW) (for example, in the syndrome value S1, the bit P4 is exchanged with the bit D4). Consequently, this bit becomes the same as that in the data received in the normal operation mode. Therefore, in the test mode, only by exchanging one bit by the exclusive-OR circuit XOR2 (SW), it is possible for each of the circuit blocks in the syndrome generation circuit 40 to generate each of the syndromes S1–4 with the same logic as that in the normal operation mode. The number of bit data for exchange in the test mode can be minimized, resulting in the minimum circuit scale for exchange.

Figure 12:
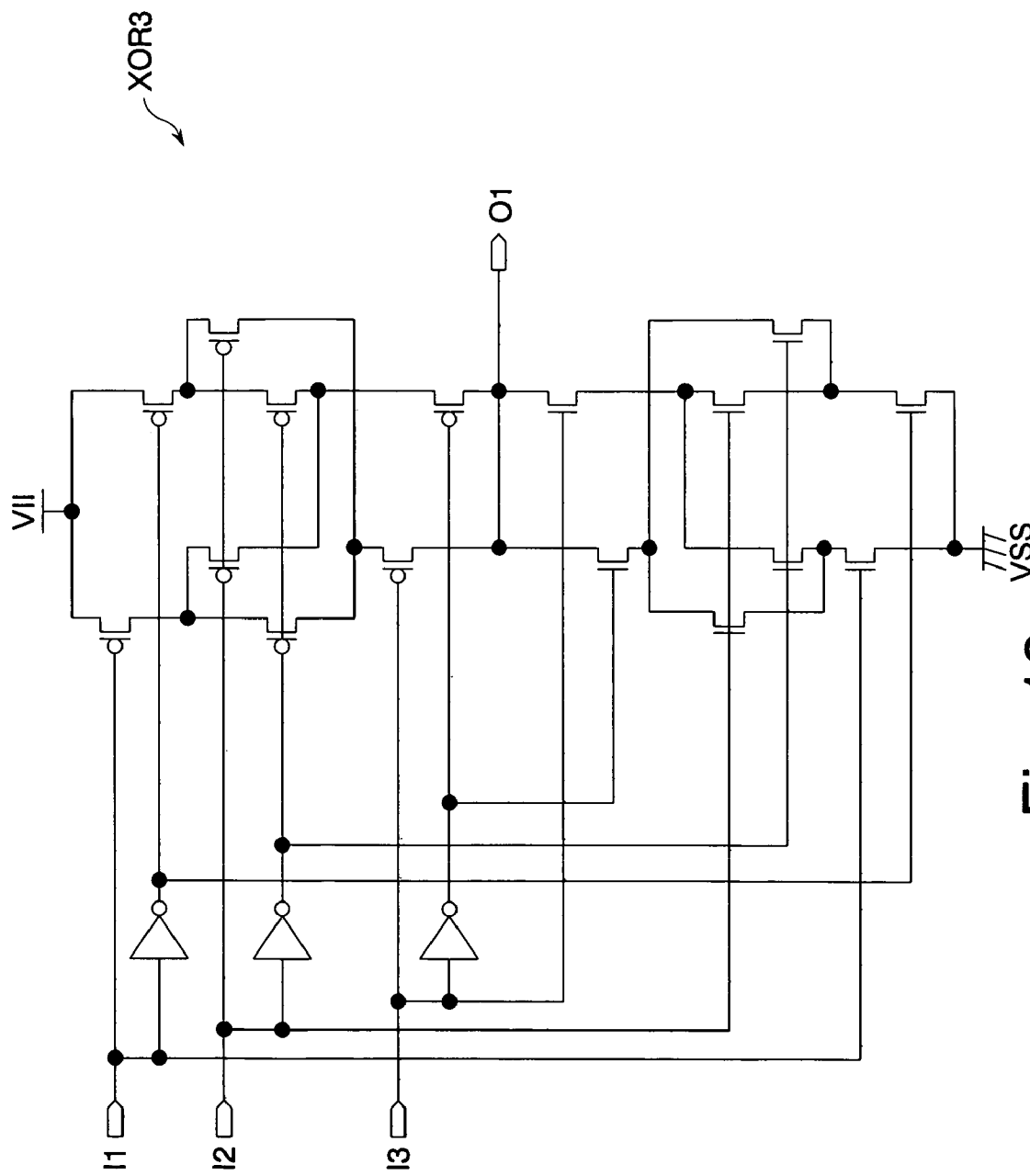
FIG. 12 is a circuit diagram showing details of an exclusive-OR circuit XOR3 shown in FIG. 10.
Figure 13:
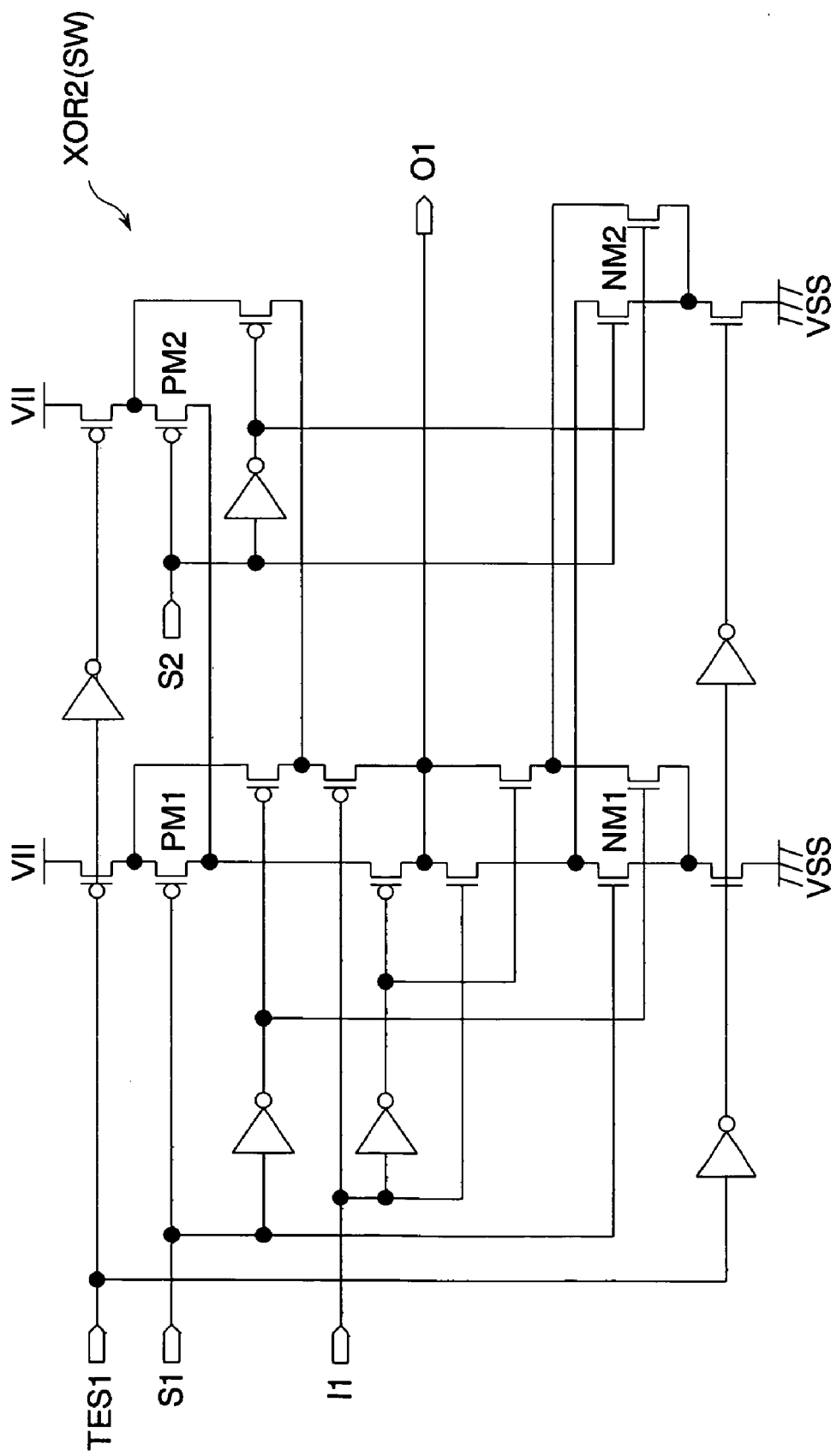
FIG. 13 is a circuit diagram showing details of an exclusive-OR circuit XOR2 shown in FIG. 10.

FIG. 12 and FIG. 13 show details of the exclusive-OR circuits XOR3, XOR2 (SW) shown in FIG. 10. In FIG. 13, the exclusive-OR circuit XOR2 (SW) is a composite gate circuit constituted of a 2-input exclusive-OR circuit with a switching function incorporated therein.

When the test signal TES1 is at low level, the exclusive-OR circuit XOR2 (SW) activates a pMOS transistor PM1 and an nMOS transistor NM1 and deactivates a pMOS transistor PM2 and an nMOS transistor NM2. In this case, an exclusive-OR of input signals S1, I1 is calculated. On the other hand, when the test signal TES1 is at high level, the exclusive-OR circuit XOR2 (SW) activates the pMOS transistor PM2 and the nMOS transistor NM2 and deactivates the pMOS transistor PM1 and the nMOS transistor NM1. In this case, an exclusive-OR of input signals S2, I1 is calculated.

The transistors PM1, PM2, NM1, NM2, and a transistor receiving the test signal TES1 and its inverted signal function as a switch part switching a bit of the regular cell from a bit of the parity data, which has been substituted by the switch circuit 48, back to the bit of the original regular data. The exclusive-OR circuit XOR2 (SW) controls the supply of source voltages (a power supply voltage VII, a ground voltage VSS) of the transistors PM1, PM2, NM1, NM2 according to the test signal TES1 to perform the switching operation. Therefore, the number of logical stages of the exclusive-OR circuit XOR2 (SW) can be the same as that of a typical 3-input exclusive-OR circuit. There occurs no increase in the number of the logical stages due to the addition of the switching function, resulting in no lowered speed of the logical operation.

Figure 14:
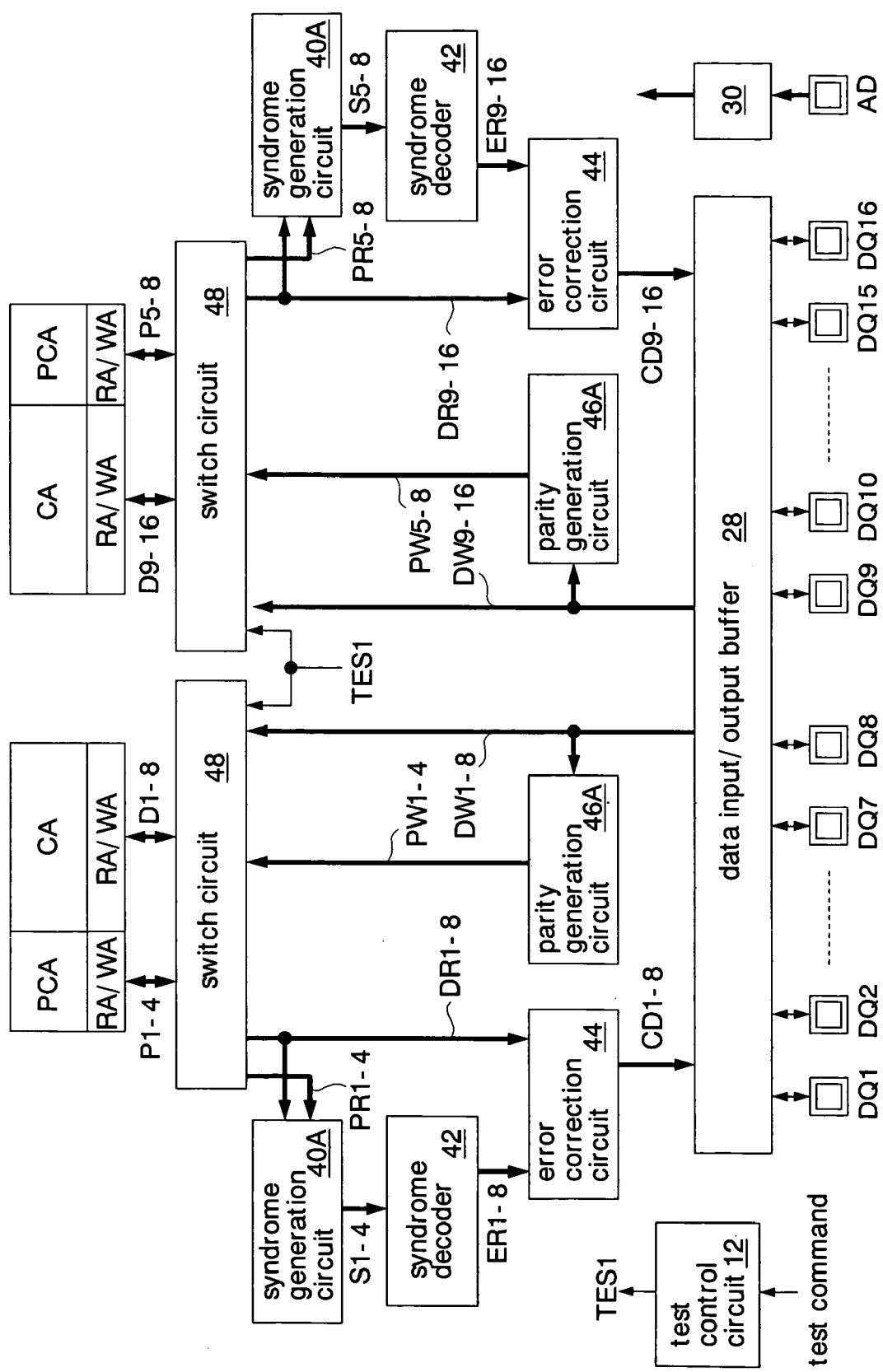
FIG. 14 is a block diagram showing a comparative example of the second embodiment.

FIG. 14 shows a comparative example of the second embodiment. The same reference codes are used to designate the same elements as the elements in FIG. 9. In this example, each syndrome generation circuit 40A generates syndromes S1–4 (or S5–8) by using read data DR1–8 (or D9–16) and parity read data PR1–4 outputted from a switch circuit 48.

Figure 15:
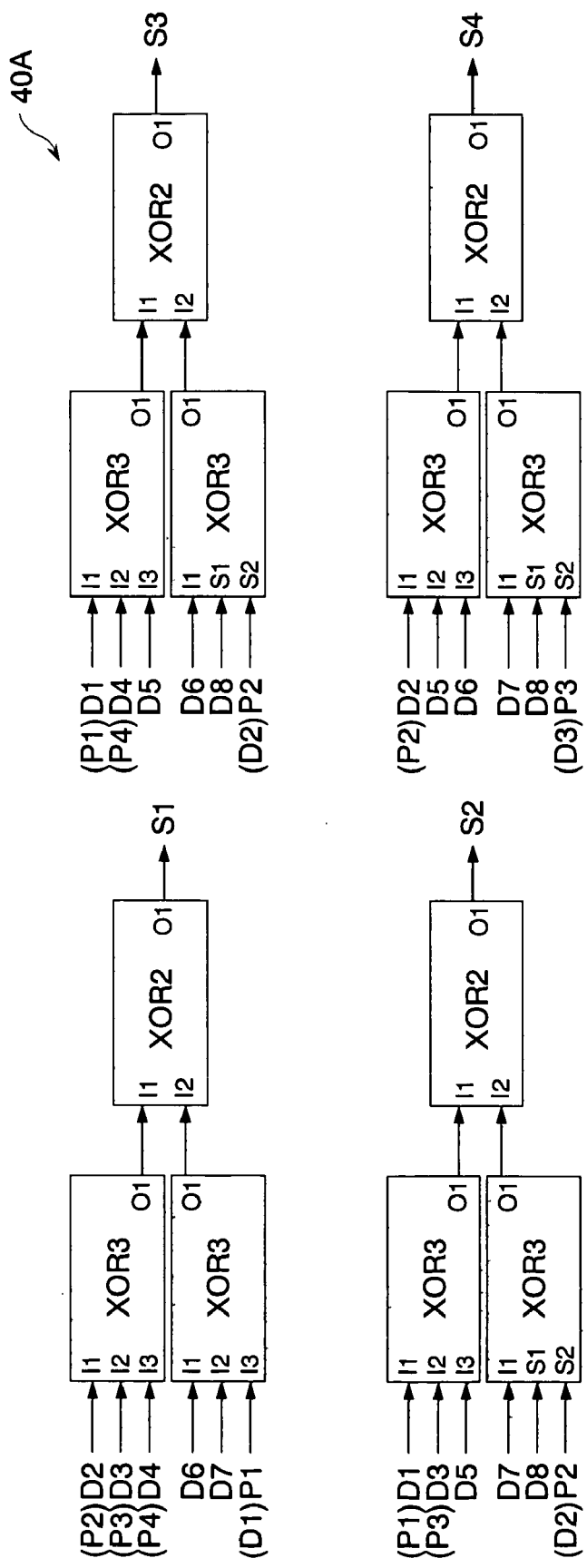
FIG. 15 is a block diagram showing details of a syndrome generation circuit shown in FIG. 14.

FIG. 15 shows details of the syndrome generation circuit 40A shown in FIG. 14. The syndrome generation circuit 40A is constituted of four circuit blocks for generating the 4-bit syndrome values S1–4. Each of the blocks has two 3-input exclusive-OR circuits XOR3 and a 2-input exclusive-OR circuit XOR2.

Parenthesized data out of input data of the exclusive-OR circuits XOR3 represent data actually received (exchange data) in the test mode. For example, the block generating the syndrome value S1 receives data D2–4, D6, D7, P1 in the normal operation mode, and receives data P2–4, D6, D7, D1 in the test mode. Therefore, the syndrome generation circuit 40A requires four switch parts for exchange of the parenthesized 4-bit data. Each of the other blocks also requires two switch parts for exchange of 3-bit or 2-bit data. Due to a large number of bits that need to be exchanged, a larger number of the switch parts are formed, so that the syndrome generation circuit 40A is larger in circuit scale than the syndrome generation circuit 40.

FIG. 16 shows an operation of the syndrome generation circuit 40A shown in FIG. 15.

As in FIG. 11 described above, a parity generation circuit 46A uses 5-bit data marked with the circles in the drawing to generate each of parity data P1–4. Arithmetic expressions of the syndromes S1–4 correspond to logics of the circuit blocks shown in FIG. 15.

In the arithmetic expressions for generating the syndromes S1–4 for the test mode (test signal TES1=high level (H)), an upper side of the right side represents data actually inputted to the circuit block, out of the actual data D1–8, P1–4. As described in FIG. 15, in this example, a plurality of bits (underlined bit data in each of the expressions) out of the data supplied to each of the circuit blocks of the syndrome generation circuit 40A need to be exchanged in the test mode. Therefore, many switches for data exchange are necessary. Moreover, data supplied to the syndrome generation circuit 40A are supplied via the switch circuit 48. The switch circuit 48 has in a read path the logic gate constituted of the plural stages as shown in FIG. 6. Accordingly, the time required for generating corrected data CD1–8 from data read from cell arrays CA, PCA (critical path) is longer than that in FIG. 9. On the other hand, the pseudo SRAM in FIG. 9 realizes a relatively shorter time for generating the corrected data CD1–8, so that the read access time can be shortened.

The second embodiment described above can also provide the same effects as those of the foregoing first embodiment. In addition, in this embodiment, the read data D1–8, P1–4 inputted to the syndrome generation circuit 40 are data that have not passed through the switch circuit 48. Accordingly, the time from the read of the read data D1–8, P1–4 from the cell arrays CA, PCA to the generation of the corrected data CD1–8 can be shortened. As a result, the read access time of the pseudo SRAM can be shortened. The data assigned to each of the parity data P1–4 include the regular data ending in the same number, which reduces the number of bits of the data to be exchanged in the syndrome generation circuit 40 in the test mode. Therefore, it is possible to reduce the scale of a circuit for data exchange to reduce chip size of the pseudo SRAM.

Figure 17:
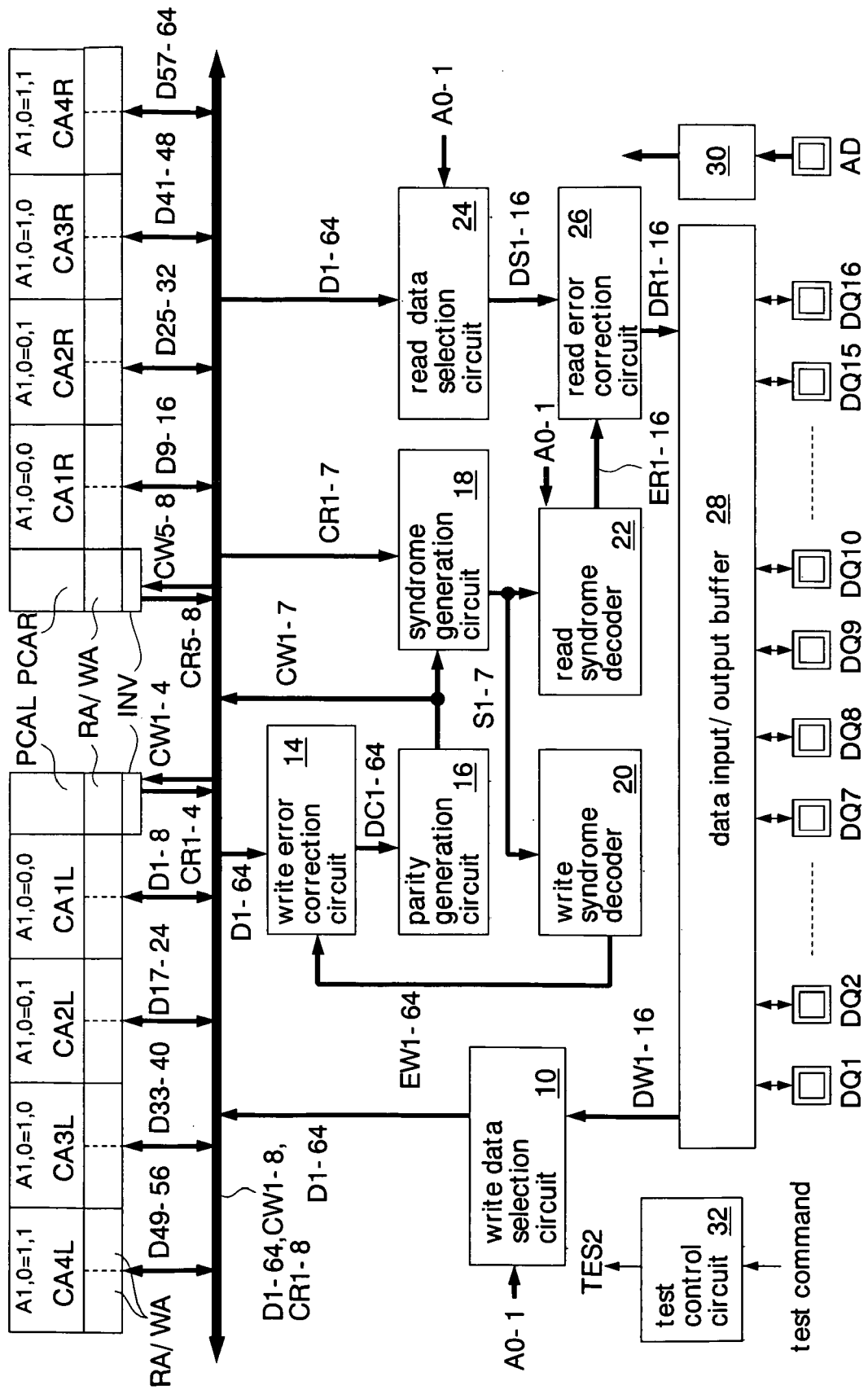
FIG. 17 is a block diagram showing a third embodiment of the semiconductor memory of the present invention.

FIG. 17 shows a third embodiment of the semiconductor memory of the present invention. The same reference codes are used to designate the same elements as the elements described in the first embodiment, and detailed description thereof will be omitted.

In this embodiment, inversion circuits INV and a test control circuit 32 are formed in place of the switch circuits SW and the test control circuit 12 of the first embodiment. Further, an inversion control circuit 34 shown in FIG. 18 to be described later is newly formed. The write amplifier switch circuit WASW of the first embodiment is not formed. The other configuration is the same as that of the first embodiment. That is, this semiconductor memory is formed as a pseudo SRAM on a silicon substrate by using a CMOS process.

The inversion circuits INV are formed in areas adjacent to read amplifiers RA/write amplifiers WA of parity cell arrays PCAL, PCAR, respectively. In other words, each of the inversion circuits INV is disposed between parity data lines CW1–4 (CR1–4) and the parity cell array PCAL or between parity data lines CW5–8 (CR5–8) and the parity cell array PCAR. The test control circuit 32, similarly to the test control circuit 12 of the first embodiment, shifts the pseudo SRAM from a normal operation mode to a test mode in response to a test command supplied via a command terminal. The test control circuit 32 temporarily changes a test signal TES2 from low level to high level in response to the shift to the test mode. That is, when the pseudo SRAM shifts to the test mode, the test signal TES2 having a high-level pulse is generated. The test signal TES2 is kept at low level in the normal operation mode.

Figure 18:
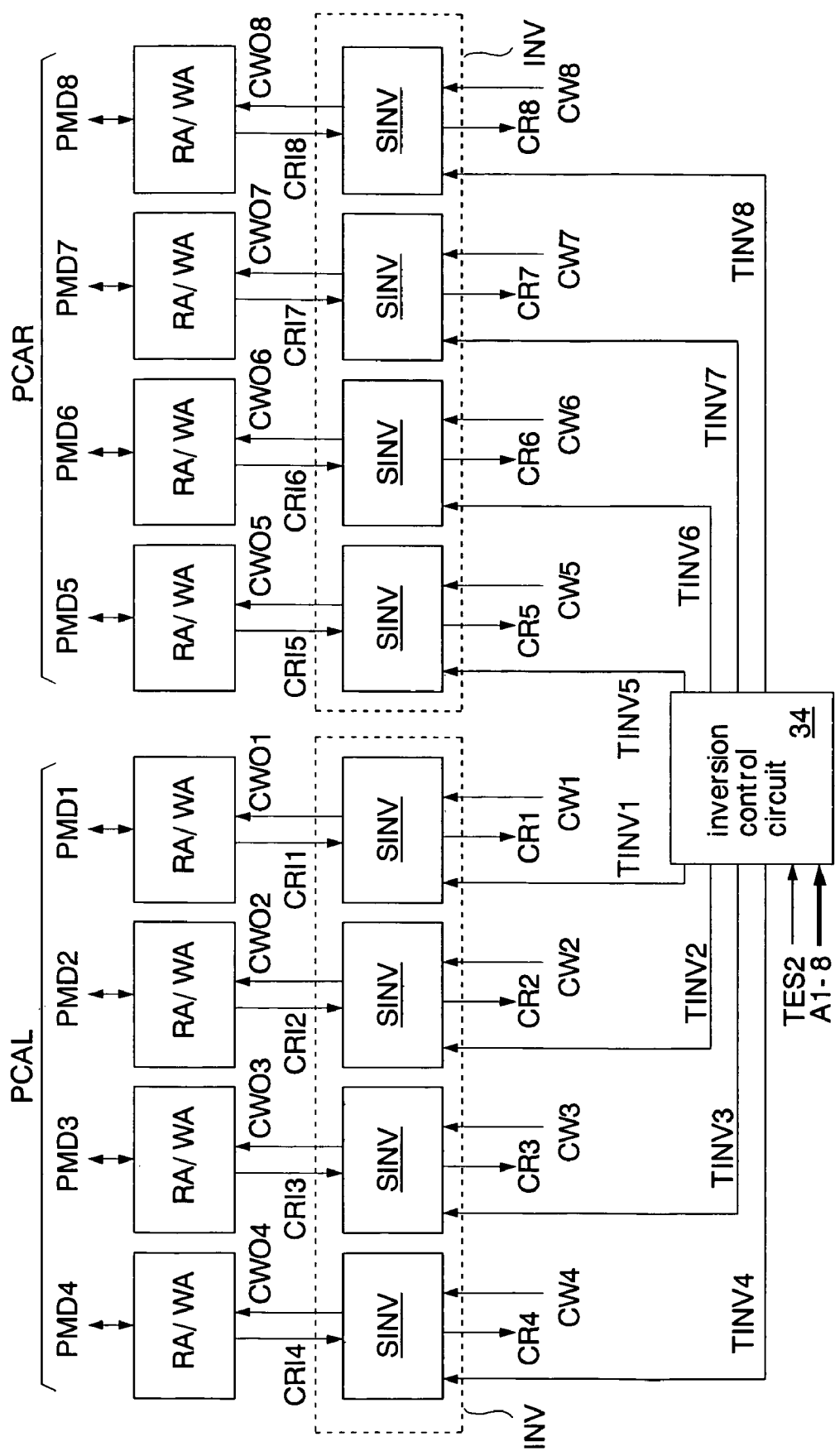
FIG. 18 is a block diagram showing details of inversion circuits INV shown in FIG. 17 and an inversion control circuit.

FIG. 18 shows details of the inversion circuits INV and the inversion control circuit 34 shown in FIG. 17. Each of the inversion circuits INV has four sub inversion circuits SINV corresponding to the parity data lines CW1–4 (CR1–4) or the parity data lines CW5–8 (CR5–8). That is, the sub inversion circuit SINV is formed for each bit of parity data CW1–8 (or CR1–8). While receiving a high-level inversion control signal TINV1 (or TINV2–8), each of the sub inversion circuits SINV inverts the write parity data CW1 (or CW2–8) and the read parity data CRI1 (or CRI2–8) to output them as write parity data CWO1 (or CWO2–8) and read parity data CR1 (or CR2–8), respectively.

On the other hand, while receiving the inversion control signal TINV1 (or TINV2–8) at low level, each of the sub inversion circuits SINV inverts neither the write parity data CW1 (or CW2–8) nor the read parity data CRI1 (or CRI2–8) but outputs them as the write parity data CWO1 (or CWO2–8) and the read parity data CR1 (or CR2–8), respectively.

Thus, in this embodiment, the inversion circuits INV can invert a logical value of a desired bit of the parity data CW1–8 (CRI1–8) inputted/outputted to/from the parity cell arrays PCA. As a result, it is possible to easily write test data with desired patterns to the parity cell arrays PCA to conduct a test of the parity cell arrays PCA. For example, a leakage test between bit lines BL (/(BL) in the parity cell arrays PCA or a leakage test between memory cells MC can be easily conducted. Further, inversion operations of the sub inversion circuits SINV are independently controlled by the inversion control signals TINV1–8, respectively, so that logical values of desired bits of the parity data CW1–8 (CRI1–8) can be individually inverted independently from one another, which can facilitate writing desired data patterns to the parity cell arrays PCA.

The inversion control circuit 34 receives addresses A1–8 in synchronization with the high-level pulse of the test signal TES2 and sets the inversion control signals TNV1–8 to high level or low level according to the logic levels of the received addresses A1–8. This means that the addresses A1–8 supplied to external address terminals function as an inversion control signal controlling the inversion operation of the inversion circuits INV in the test mode.

The logical values of the inversion control signals TINV1–8 are set according to at least one of a row address (word line selection address) for selecting a word line WL and a pattern of test data read/written from/to the regular cell arrays CA1–4. Setting the inversion control signals TINV1–8 to desired values makes it possible to write various test patterns to the parity cell arrays PCA.

Figure 19:
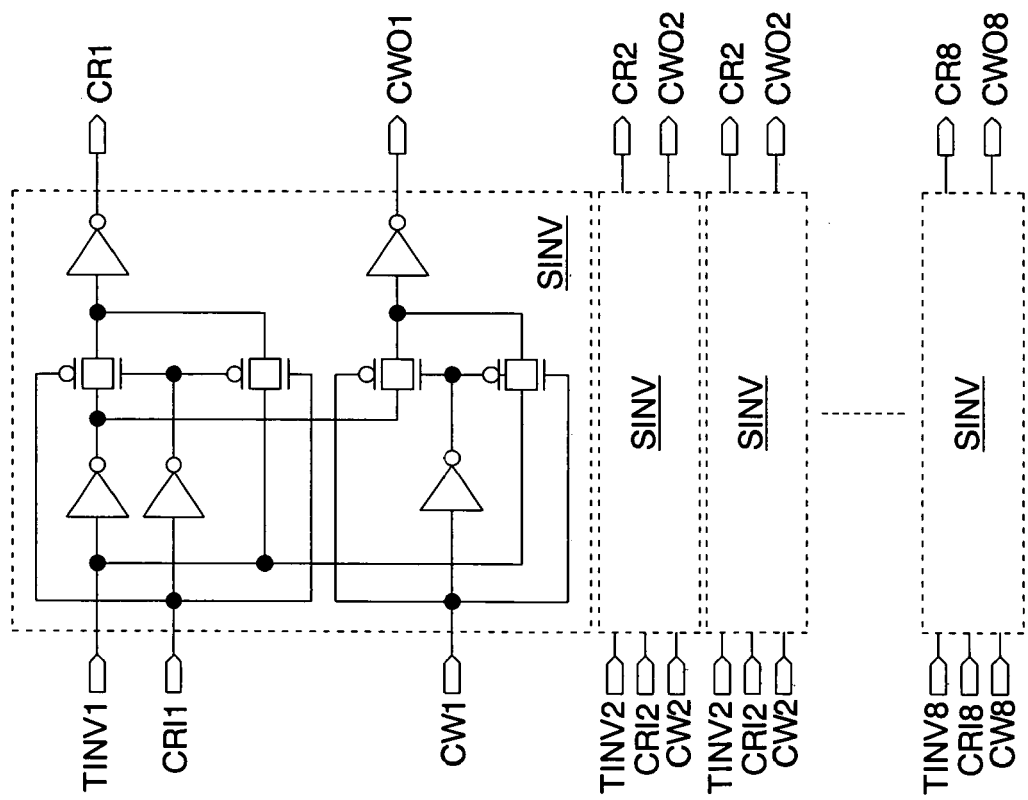
FIG. 19 is a circuit diagram showing details of a sub inversion circuit SINV shown in FIG. 18.

FIG. 19 shows details of the sub inversion circuit SINV shown in FIG. 18. All of the sub inversion circuits SINV are the same circuits, and therefore, only the sub inversion circuit SINV corresponding to the parity data CW1 (CR1) will be described. The sub inversion circuit SINV has an exclusive-OR circuit constituted of a pair of CMOS transmission gates corresponding to the read parity data CR1, CRI1, an exclusive-OR circuit constituted of a pair of CMOS transmission gates corresponding to the write parity data CW1, CW01, and driver circuits (CMOS inverters) connected to outputs of the exclusive-OR circuits, respectively.

The exclusive-OR circuits operate logical values of the inversion control signal TINV1 and the read parity data CRI1 and logical values of the inversion control signal TINV1 and the write parity data CW1, respectively. By these operations, in a high-level period of the inversion control signal TINV1, the logical values of the read parity data CRI1 and the write parity data CW1 are both inverted to be outputted as the read parity data CR1 and the write parity data CW01, respectively. Therefore, as in the normal operation mode, a parity generation circuit 16, a write error correction circuit 14, and a read error correction circuit 26 can function normally. In other words, a test can be conducted while an error correction function is kept effective. In a low-level period of the inversion control signal TINV1, the logical values of the read parity data CRI1 and the write parity data CW1 are not inverted to be outputted as the read parity data CR1 and the write parity data CW01.

Figure 20:
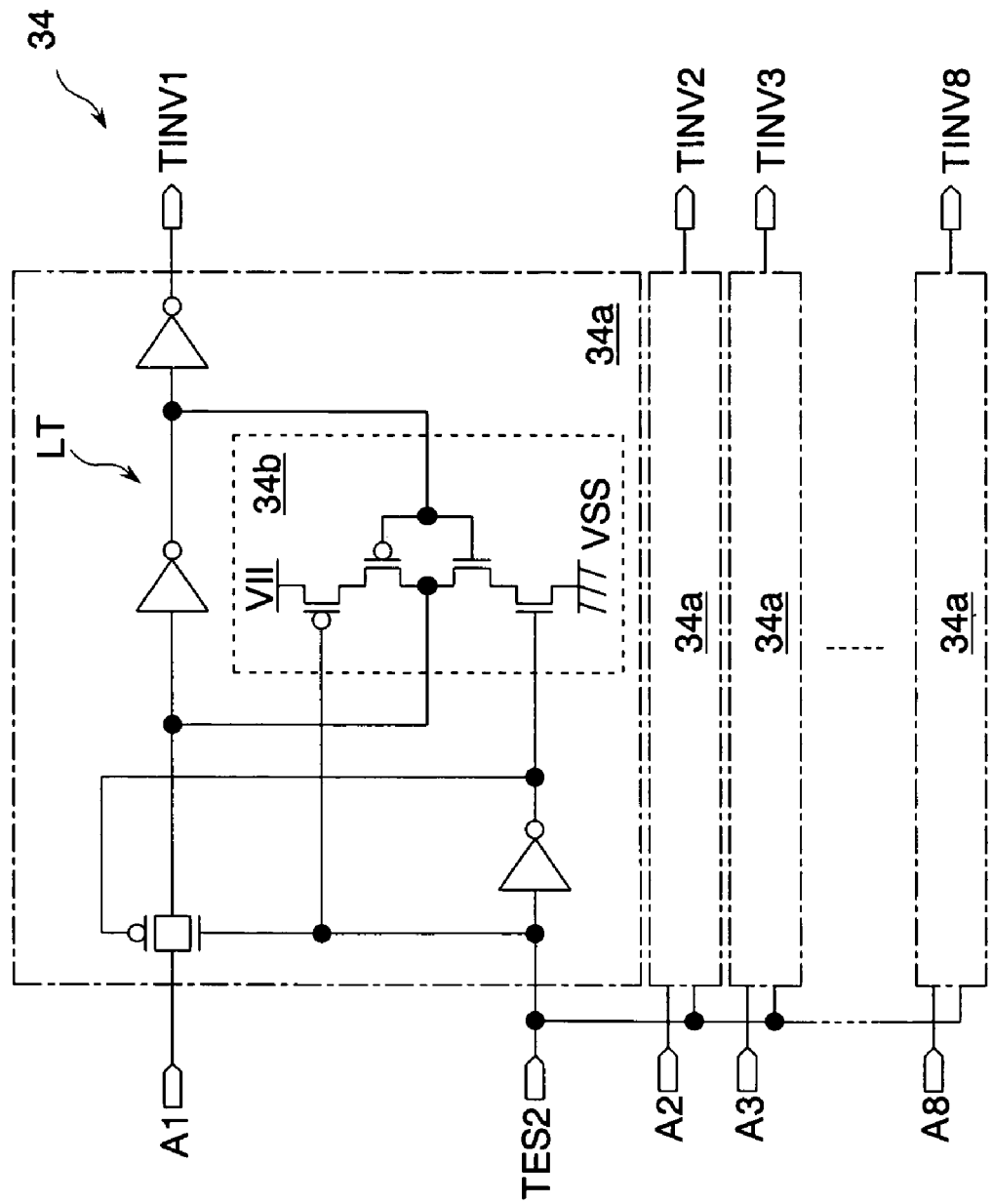
FIG. 20 is a circuit diagram showing details of the inversion control circuit shown in FIG. 18.

FIG. 20 shows details of the inversion control circuit 34 shown in FIG. 18. The inversion control circuit 34 is formed in, for example, an operation control circuit (not shown). The inversion control circuit 34 is constituted of eight sub control circuits 34a corresponding to the inversion control signals TINV1–8 and receiving the addresses A1–8. All the sub control circuits 34a are the same circuits, and therefore, only the sub control circuit 34a corresponding to the inversion control signal TINV1 will be described. The sub control circuit 34a has a latch circuit LT for latching the address A1, a CMOS transmission gate for transferring the address A1 to the latch circuit LT, and a driver circuit (CMOS inverter) connected to an output of the latch circuit LT. The latch circuit LT is constituted by connecting an input and an output of the inverter and a clocked inverter 34b to each other.

The CMOS transmission gate is ON in a high-level period of the test signal TES2. The clocked inverter 34b is ON in a low-level period of the test signal TES2. Accordingly, the address A1 supplied via the CMOS transmission gate in the high-level period of the test signal TES2 is latched by the latch circuit LT in synchronization with a change of the test signal TES2 to low level. The driver circuit inverts the address A1 outputted from the latch circuit LT to output it as the inversion control signal TINV1. Therefore, by setting only a predetermined bit of the addresses to high level in synchronization with the high-level period of the test signal TES2, an LSI tester or the like testing the pseudo SRAM can set the inversion control signals TINV1–8 to desired logic levels and can make only a desired one of the sub inversion circuits SINV perform the inversion operation.

The third embodiment described above can also provide the same effects as those of the foregoing first embodiment. In addition, in this embodiment, owing to the inversion circuits INV, it is possible to easily write test data of desired patterns to the parity cell arrays PCA, so that the parity cell arrays PCA can be tested. It is possible to individually invert the logical value of a desired bit of the parity data CW1–8 (CRI1–8) independently, which makes it possible to easily write desired data patterns to the parity cell arrays PCA. The test can be conduced while the error correction function is kept effective as in the normal operation mode.

Figure 21:
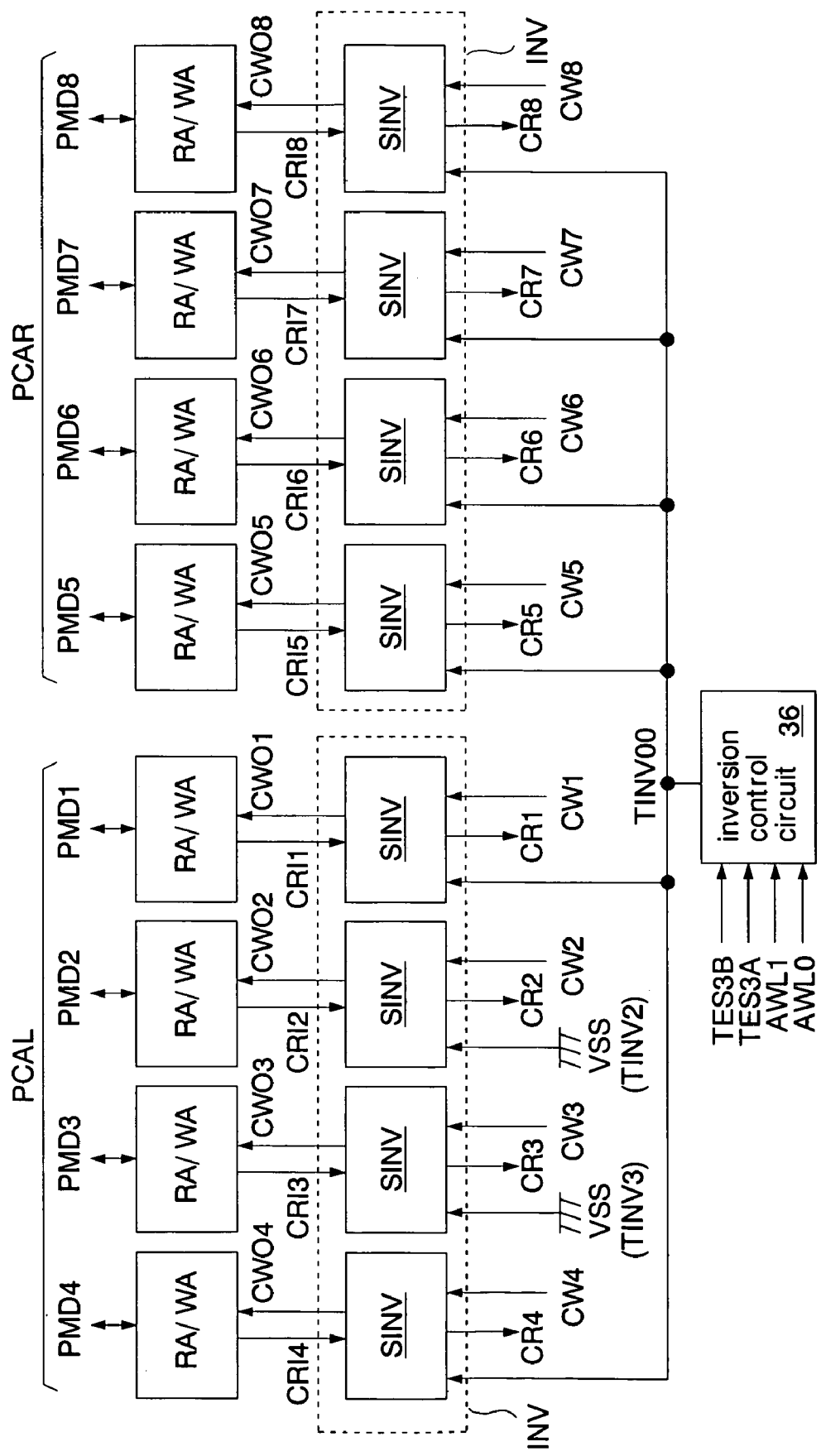
FIG. 21 is a block diagram showing details of inversion circuits and an inversion control circuit in a fourth embodiment of the semiconductor memory of the present invention.

FIG. 21 shows details of inversion circuits INV and an inversion control circuit 36 in a fourth embodiment of the semiconductor memory of the present invention. The same reference codes are used to designate the same elements as the elements described in the first and third embodiments, and detailed description thereof will be omitted. This embodiment is different from the third embodiment in the signal level supplied to the inversion circuits INV and in the inversion control circuit 36. Further, a test control circuit (not shown) corresponding to the test control circuit 32 shown in FIG. 17 has two test mode setting circuits similar to the sub control circuits 34a of the inversion control circuit 34 of the third embodiment. The test mode setting circuits latch logic levels of 2-bit addresses A1–0 in synchronization with a test signal TES3 (not shown) with a high-level pulse outputted by the test control circuit to output them as test mode signals TES3A, TES3B. The other configuration is the same as that of the third embodiment. That is, this semiconductor memory is formed as a pseudo SRAM on a silicon substrate by using a CMOS process.

Generally, when the logics of write data D1–64 to regular cell arrays CA1–4 are "all 0", the logics of the parity data thereof are also "all 0". Therefore, a write pattern of the regular cell arrays CA1–4 matches a write pattern of the parity cell arrays PCA. On the other hand, when the logics of the write data to the regular cell arrays CA1–4 are "all 1", the logics of the parity data thereof differ depending on the logic of the parity generation circuit 16. In this embodiment, when the logics of the write data D1–64 are "all 1", the logics of the parity data CW1–8 are "01100000".

Therefore, the logics of the parity data CW1, 4–8 are constantly "0", whether the logics of the write data D1–64 are "all 0" or "all 1", and the logics of the parity data CW2–3 match the logics of the write data D1–64. In other words, when the logics of the write data D1–64 are "all 1", the logics of the parity data CW1, 4–8 are inverted so that the logics of the parity data constantly match the logics of the write data D1–64. As a result, the test pattern written to the parity cell arrays PCA is made equal to the test pattern written to the regular cell arrays CA1–4.

Since the inversion of the parity data CW2–3 is not necessary irrespective of the logics of the write data D1–64, the inversion circuit SINV of this embodiment is structured such that terminals receiving inversion control signals (TINV2–3 of the third embodiment) of the sub inversion circuits SINV corresponding to the parity data CW2–3 (CR2–3) are connected to a ground line VSS (dummy sub inversion circuits). Therefore, the dummy inversion circuits always output the parity data CW2–3 (CRI2–3) as they are without inverting them. Terminals receiving the inversion control signals in the other sub inversion circuits SINV receive a common inversion control signal TINV00. Since the operations of the plural sub inversion circuits SINV can be simultaneously controlled with the common inversion control signal TINV00, the inversion control circuit 36 can have a simple structure. Further, a wiring area of a signal line for transmitting the inversion control signal TINV00 can be made small. As a result, chip size of the pseudo SRAM can be reduced.

Since the dummy sub inversion circuits are disposed even in signal paths that do not invert the parity data CW2–3 (CRI2–3), the transmission paths of all the parity data CW1–8 (CR1–8) have substantially the same load (the number of transistors, gate capacitance of the transistors, or wiring capacitance). As a result, timing skew among the parity data CW1–8 (or CR1–8) becomes small to allow a larger timing margin. Since the sub inversion circuits SINV including the dummy sub inversion circuits can be regularly arranged, halation or the like ascribable to a discontinuous pattern forming the circuit can be prevented, which can prevent a characteristic change of transistors. The halation tends to occur in areas with densely arranged elements such as the cell arrays and the vicinity of the cell arrays. Therefore, a halation countermeasure in the inversion circuits INV disposed in the vicinity of the parity cell arrays PCA is important.

Since a connection destination of the terminal receiving the inversion control signal is set to a signal line of the inversion control signal TINV00 or the ground line VSS, it is possible to invert the parity data CW, CR according to the inversion control signal TINV00 or to always transmit the parity data CW, CR without inverting them. In short, a circuit change can be facilitated.

The inversion control circuit 36 discriminates the kind of a test mode according to the logical values of the test mode signals TES3A, TES3B, and changes the inversion control signal TINV00 common to the sub inversion circuits to high level or low level according to low-order 2 bits AWL1-0 (word line selection address) of a row address for selecting a word line WL (FIG. 4). The logical values of the test mode signals TES3A, TES3B indicate the kind of the test.

Figure 22:
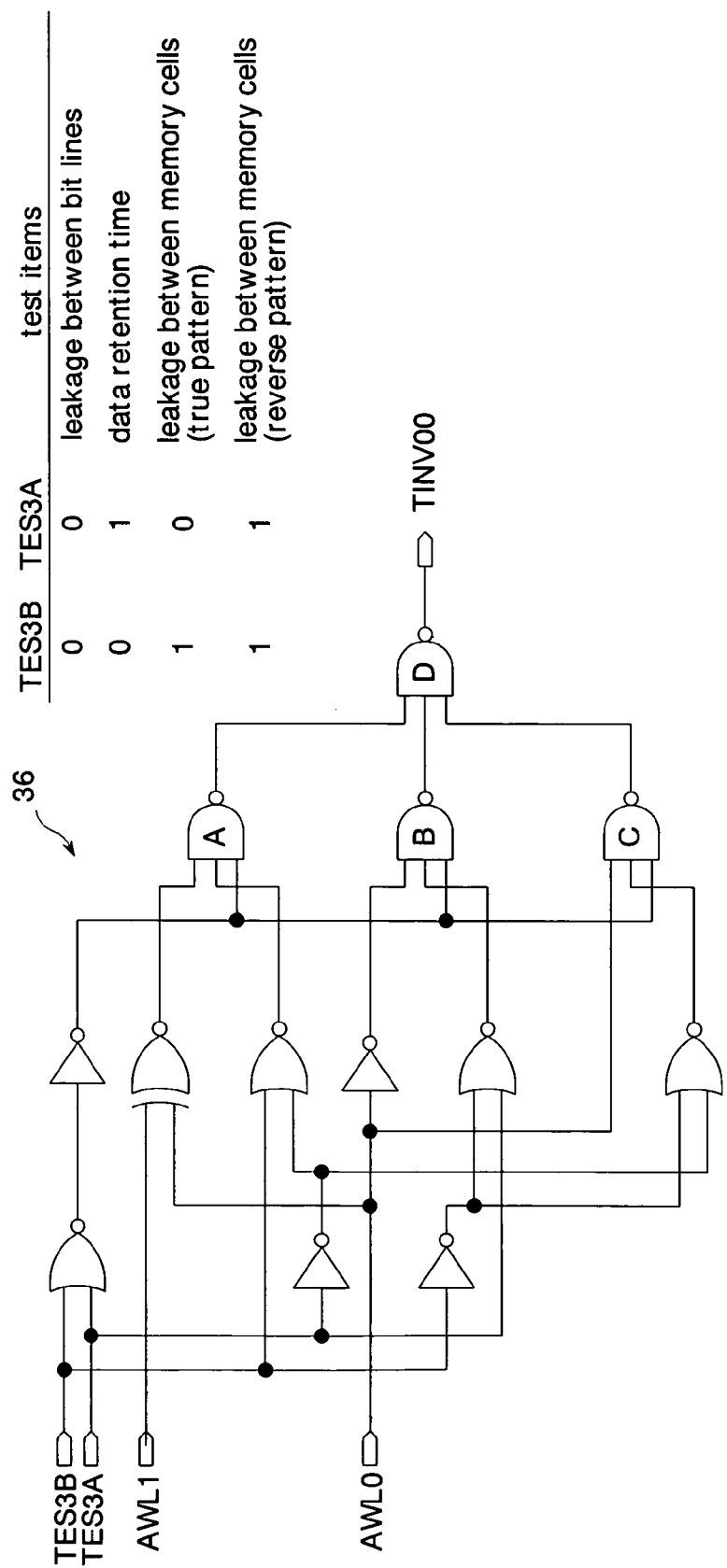
FIG. 22 is a circuit diagram showing details of the inversion control circuit shown in FIG. 21.

FIG. 22 shows details of the inversion control circuit 36 shown in FIG. 21. The inversion control circuit 36 has three decoding circuits A, B, C (3-input NAND gates) that are activated when the logics of the test mode signals TES3B, TES3A are "01", "10", and "11", respectively, and a 3-input NAND gate D that calculates an OR logic of outputs of the decoding circuits A-C to output it as the inversion control signal TINV00. When the logics of the test mode signals TES3B, TES3A are "00" (a first test mode), the decoding circuits A, B, C are all deactivated and the inversion control signal TINV00 is fixed to low level. That is, in the first test mode, the parity data CW1–8 (CR1–8) are not inverted. The first test mode is a mode in which data with reverse logics are written to bit lines BL, /BL adjacent to each other and leakage between the bit lines BL, /BL is tested, as shown in later-described FIG. 23.

Figure 24:
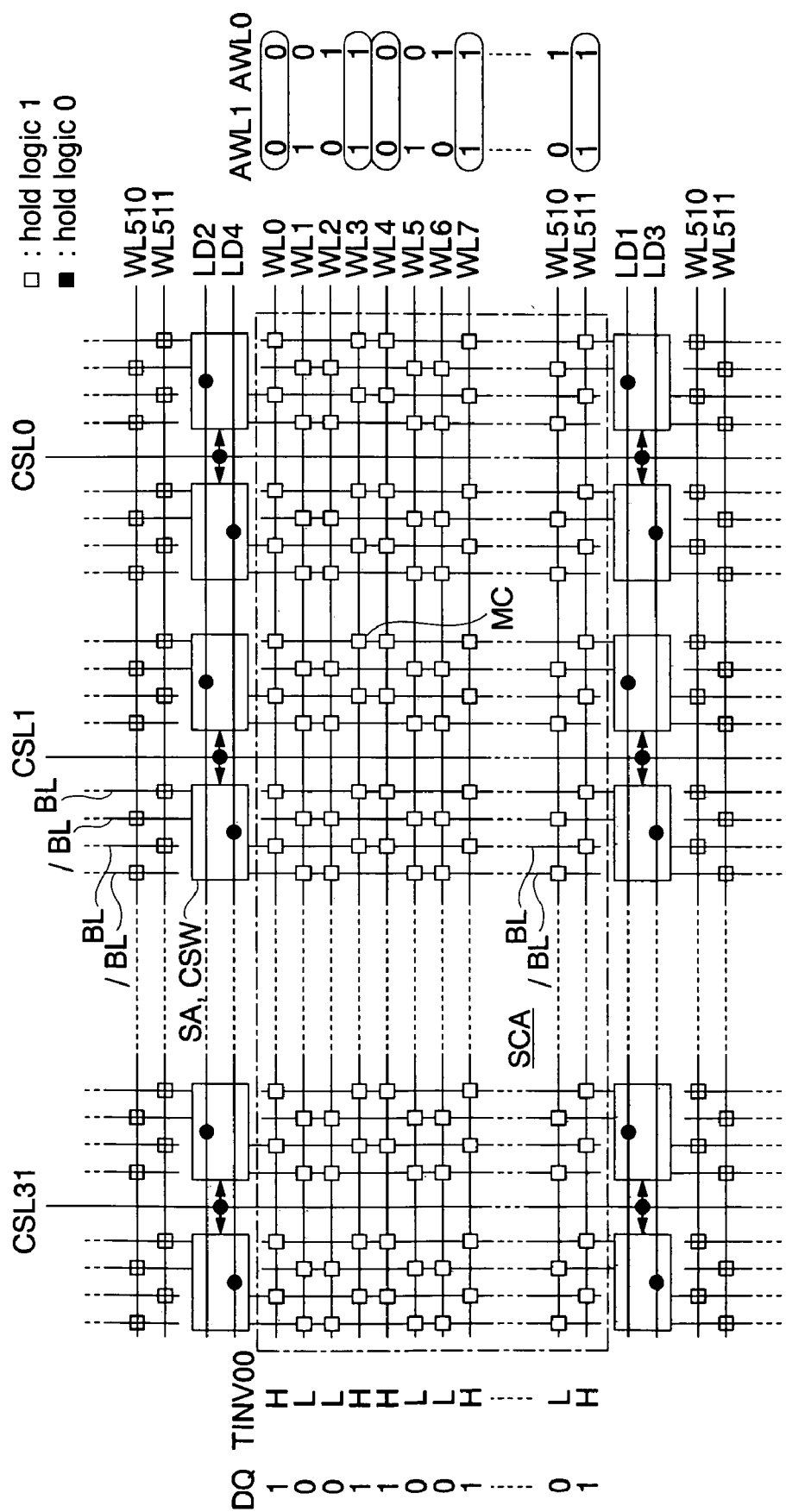
FIG. 24 is an explanatory view showing a test pattern that is written to the memory cells in order to test data retention time of the memory cells.

When the logics of the test mode signals TES3B, TES3A are "01" (a second test mode), only the decoding circuit A is activated. The decoding circuit A outputs low level in order to set the inversion control signal TINV00 to high level only when the bit values of the word line selection addresses AWL1-0 are the same. The second test mode is a mode in which logic 1 is written to all memory cells MC (memory cell capacitors are charged) and data retention time of the memory cells MC is tested, as shown in FIG. 24 to be described later. The data retention time is a length of time for retaining the logic 1 without any refresh of the memory cells MC, and is also called a refresh pause time.

Figure 25:
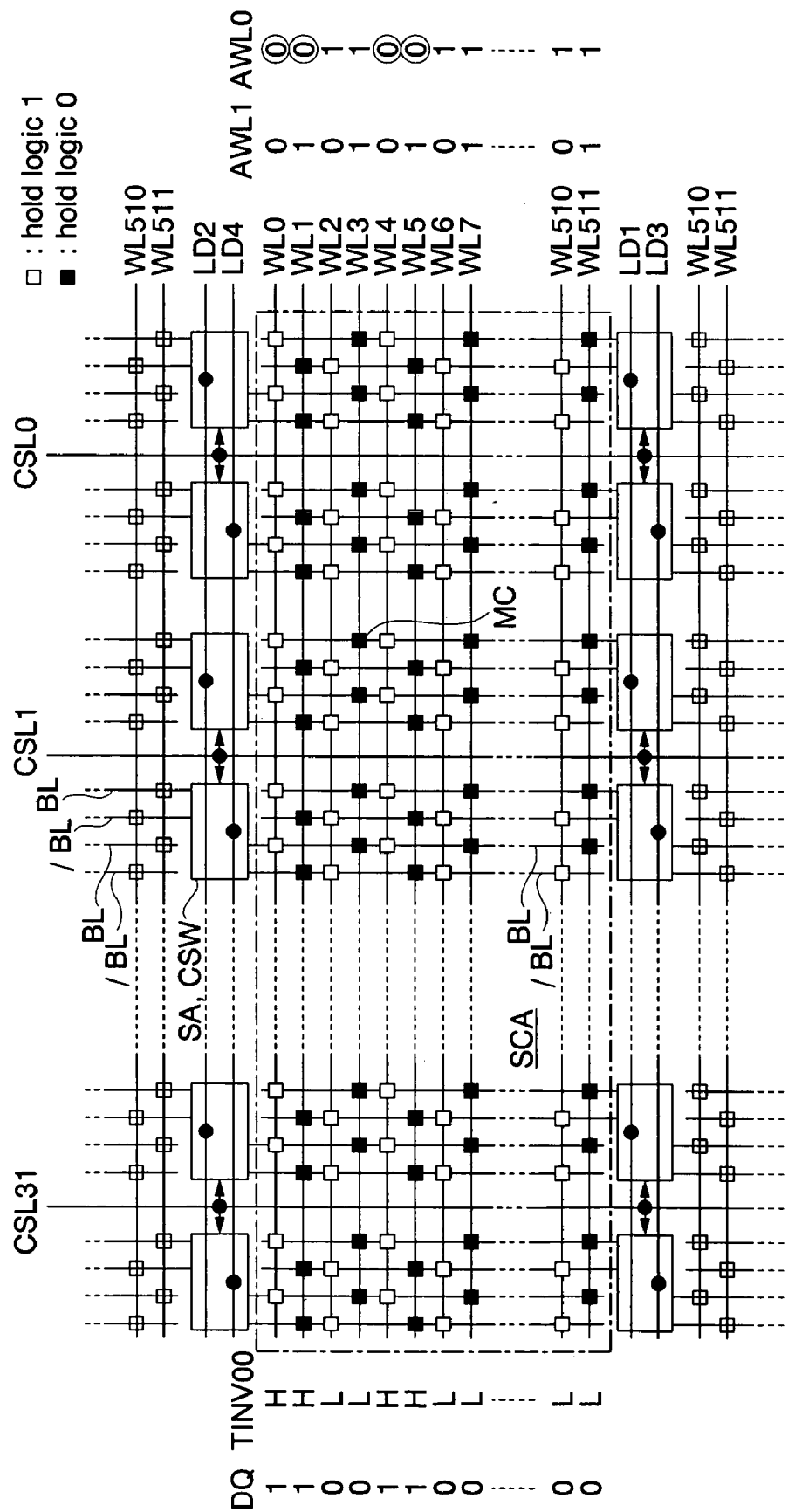
FIG. 25 is an explanatory view showing a test pattern that is written to the memory cells in order to test leakage between the memory cells.

When the logics of the test mode signals TES3B, TES3A are "10" (a third test mode), only the decoding circuit B is activated. The decoding circuit B outputs low level in order to set the inversion control signal TINV00 to high level only when the word line selection address AWL0 has logic 0. The third test mode is a mode in which leakage between adjacent memory cells MC is tested, and as shown in FIG. 25 to be described later, logic 1 is held in even-numbered word lines WL0, 2, . . . , 510, while logic 0 (true pattern) is held in odd-numbered word lines 1, 3, . . . , 511.

When the logics of the test mode signals TES3B, TES3A are "11" (a fourth test mode), only the decoding circuit C is activated. The decoding circuit C outputs low level in order to set the inversion control signal TINV00 to high level only when the word line selection address AWL0 has logic 1. The fourth test mode, similarly to the third test mode, is a mode for a leakage test between the adjacent memory cells MC, and in this mode, logic 0 is held in the even-numbered word lines WL 0, 2, . . . , 510 and logic 1 is held in the odd-numbered word lines 1, 3, . . . , 511 (reverse pattern). Thus, in this embodiment, with the simple inversion control circuit 36, it is possible to write the four test patterns, which are common to the cell arrays CA1–4, PCA, to the regular cell arrays CA1–4 and the parity cell arrays PCA.

Figure 23:
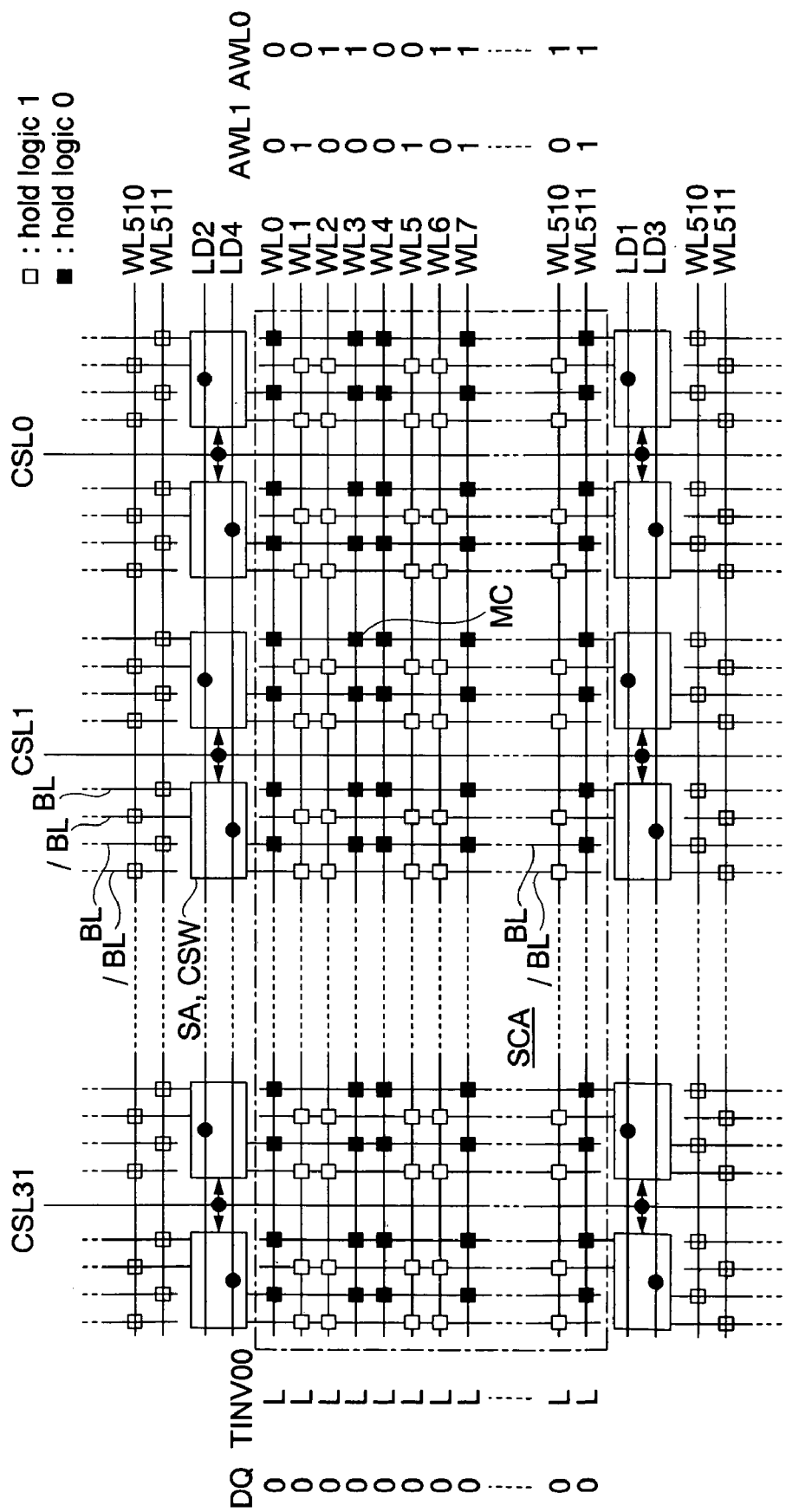
FIG. 23 is an explanatory view showing a test pattern that is written to memory cells in order to test leakage between bit lines.

FIG. 23 shows a test pattern written to the memory cells MC for the leakage test between the bit lines BL, /BL (first test mode). In the first test mode, logic 0 is supplied to all external data terminals DQ1–16. The inversion control signal TINV00 is constantly kept at low level irrespective of the word line selection addresses AWL1-0. Accordingly, logic 1 is written to the memory cells MC connected to the bit lines BL (white memory cells in the drawing), and logic 0 is written to the memory cells MC connected to the bit lines /BL (black memory cells in the drawing). A pattern of the parity data CW1–8 written to the parity cell arrays PCA is the same as the pattern of the regular data D1–64 written to the regular cell arrays CA1–4. Since data with reverse logics are written to the bit lines BL, /BL in both the regular cell arrays CA1–4 and the parity cell arrays PCA, the leakage test between the bit lines BL, /BL can be simultaneously conducted on the regular cell arrays CA1–4 and the parity cell arrays PCA.

FIG. 24. shows a test pattern written to the memory cells MC in order to test the data retention time of the memory cells MC (second test mode). In the second test mode, logic 1 is supplied to the external data terminals DQ1–16 when the word line selection addresses AWL1-0 have the same bit values, and in other cases, logic 0 is supplied to the external data terminals DQ1–16. The inversion control signal TINV00 changes to high level only when the word line selection addresses AWL1-0 have the same bit values. Therefore, logic 1 is written to the memory cells MC to which logic 0 has been written in FIG. 23. A pattern (all "1") of the parity data CW1–8 written to the parity cell arrays PCA is the same as a pattern (all "1") of the regular data D1–64 written to the regular cell arrays CA1–4. This enables simultaneous testing of the data retention time on the regular cell arrays CA1–4 and on the parity cell arrays PCA.

FIG. 25 shows a test pattern (true pattern) written to the memory cells MC for the leakage test between the memory cells MC (third test mode). In the third test mode, logic 1 is supplied to the external data terminals DQ1–16 when the word line selection address AWL0 has logic 0, and logic 0 is supplied to the external data terminals DQ1–16 when the word line selection address AWL0 has logic 1. The inversion control signal TINV00 changes to high level only when the word line selection address AWL0 has logic 0. Therefore, logics reverse to those in FIG. 23 are written to the memory cells MC connected to the word lines WL0, 1, 4, 5, . . . that are selected when the word line selection address AWL0 has logic 0. A pattern of the parity data CW1–8 written to the parity cell arrays PCA is the same as a pattern of the regular data DQ1-64 written to the regular cell arrays CA1–4. It is possible to write reverse data to the adjacent memory cells MC connected to the same bit line BL (or (/BL) in both the regular cell arrays CA1–4 and the parity cell arrays PCA, which enables simultaneous leakage testing of the memory cells MC in the regular cell arrays CA1–4 and in the parity cell arrays PCA.

Figure 26:
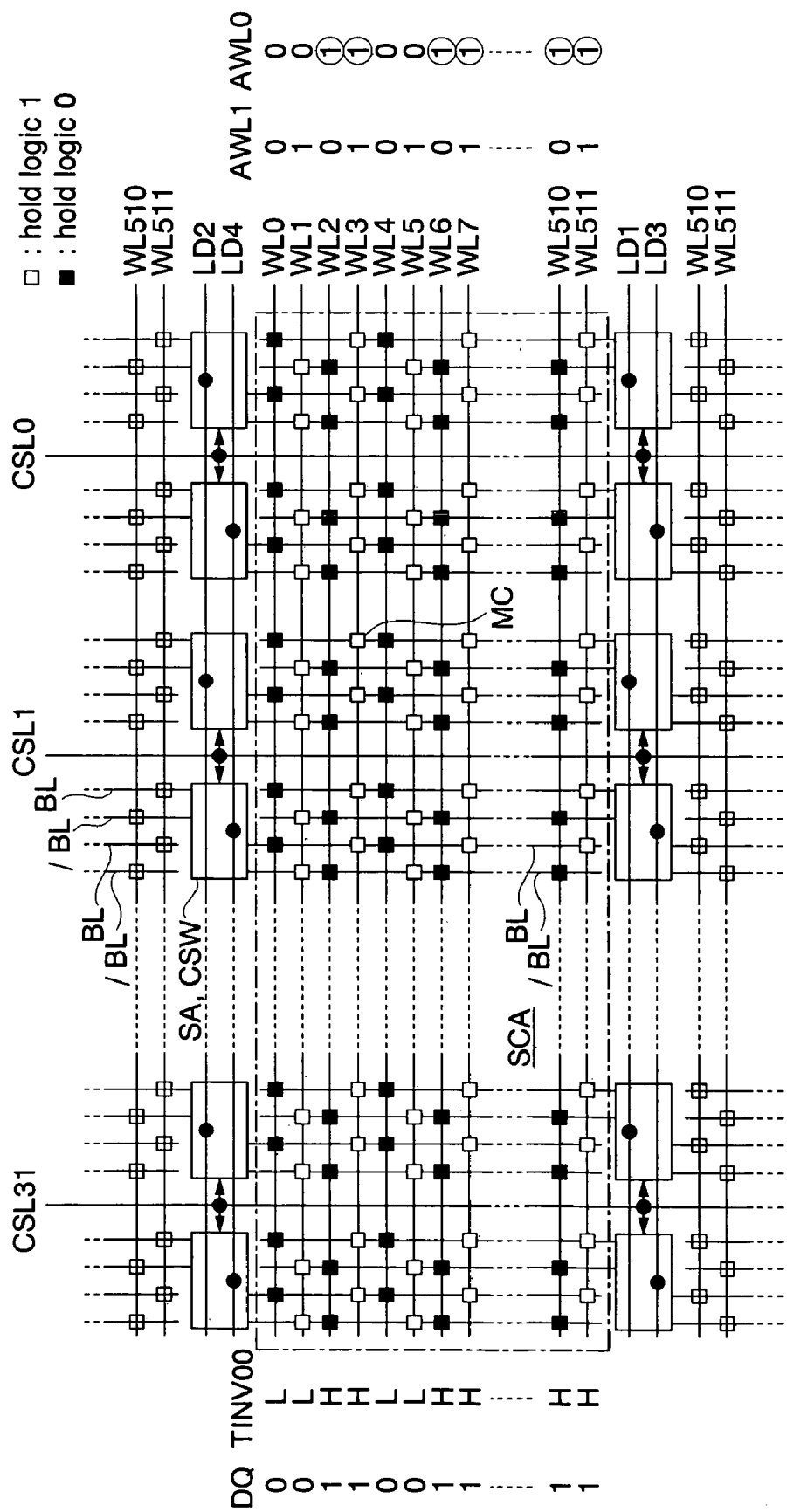
FIG. 26 is an explanatory view showing a test pattern that is written to the memory cells in order to test leakage between the memory cells.

FIG. 26 shows a test pattern (reverse pattern) written to the memory cells MC for the leakage test between the memory cells MC (fourth test mode). In the fourth test mode, logic 1 is supplied to the external data terminals DQ1–16 when the word line selection address AWL0 has logic 1, and logic 0 is supplied to the external data terminals DQ1–16 when the word line selection address AWL0 has logic 0. The inversion control signal TINV00 changes to high level only when the word line selection address AWL0 has logic 1. Therefore, logics reverse to those in FIG. 23 are written to the memory cells MC connected to the word lines WL2, 3, 6, 7 that are selected when the word line selection address AWL0 has logic 1. A pattern of the parity data CW1–8 written to the parity cell arrays PCA is the same as a pattern of the regular data D1–64 written to the regular cell arrays CA1–4. It is possible to write reverse data to the adjacent memory cells MC connected to the same bit lines BL (or /BL) in both the regular cell arrays C1-4 and the parity cell arrays PCA, which enables simultaneous leakage testing of the memory cells MC in the regular cell arrays CA1–4 and in the parity cell arrays PCA.

The fourth embodiment described above can also provide the same effects as those of the foregoing first and third embodiments. In addition, in this embodiment, the inversion control circuit 36 can have a simple configuration owing to the use of the common inversion control signal TINV00, so that chip size of the pseudo SRAM can be reduced. Timing skew among the parity data CW1–8 (CR1–8) can be made small owing to the dummy sub inversion circuits. It is possible to prevent a characteristic change of transistors ascribable to a discontinuous pattern forming a circuit. The logics of the sub inversion circuits SINV can be easily changed. The inversion/non-inversion of the logic of the inversion control signal TINV00 according to the word line selection addresses AWL1-0 can facilitate testing leakage between the memory cells MC arranged in the wiring direction of the bit lines BL, /BL.

The above embodiments have described the examples where the present invention is applied to the pseudo SRAM. The present invention is not limited to such embodiments.

Applying the present invention to other semiconductor memories such as, for example, a DRAM, an SRAM, and a ferroelectric memory can bring about the same effects.

The above embodiments have described the examples where the present invention is applied to the pseudo SRAM which has the plural regular cell arrays CA1–4 and in which data is read/written from/to one of the regular cell arrays CA1–4 according to the address. The present invention is not limited to such embodiments. Applying the present invention to, for example, a pseudo SRAM in which data is read/written only from/to one regular cell array can bring about the same effects.

The above embodiments have described the examples where the pseudo SRAM shifts from the normal operation mode to the test mode in response to the test command supplied via the command terminal to conduct the test. The present invention is not limited to such embodiments. For example, the test may be conducted in such a manner that the supply of a test command is recognized according to a voltage value (logic level) given to a test terminal of a single-purpose test pad or the like and the pseudo SRAM shifts from the normal operation mode to the test mode in response to this test command.

The foregoing third embodiment has described the example where the inversion function of the inversion circuit is made effective/ineffective according to the pattern of the test data read/written from/to the regular cell arrays CA1–4. The present invention is not limited to such an embodiment. For example, in the fourth embodiment, the inversion function of the inversion circuit may be made effective/ineffective according to the pattern of the test data read/written from/to the regular cell arrays CA1–4. In this case, a still larger number of test patterns can be used for testing the parity cell arrays PCA.

The foregoing fourth embodiment has described the example where the inversion function of the inversion circuit is made effective/ineffective according to the selection addresses AWL1–0 of the word lines WL. The present invention is not limited to such an embodiment. For example, in the third embodiment, the inversion function of the inversion circuit may be made effective/ineffective according to the selection addresses AWL1-0 of the word lines WL. This structure enables leakage test between the memory cells MC arranged in the wiring direction of the bit lines.

The invention is not limited to the above embodiments and various modifications may be made without departing from the spirit and scope of the invention. Any improvement may be made in part or all of the components.

What is claimed is:

1. A semiconductor memory comprising:
    a regular cell array from/to which regular data inputted/outputted to/from an external data terminal is read/written;
    a parity generation circuit generating parity data from the regular data;
    a parity cell array from/to which the parity data is read/written;
    an error correction circuit correcting read data from said regular cell array according to the parity data; and
    a switch circuit exchanging the regular data and the parity data with each other.

2. The semiconductor memory according to claim 1, further comprising
    a test control circuit activating a test signal in response to a test command in order to shift a state of the semiconductor memory from a normal operation mode to a test mode, and wherein
    said switch circuit
    makes a switch function effective in the test mode during which the test signal is active to input/output the regular data to/from said parity cell array and input/output the parity data to/from said regular cell array, and
    makes the switch function ineffective in the normal operation mode during which the test signal is inactive to input/output the regular data to/from said regular cell array and input/output the parity data to/from said parity cell array.

3. The semiconductor memory according to claim 1, further comprising:
    read amplifiers provided for said regular cell array and said parity cell array, respectively, each of said read amplifiers being provided for each bit of read data in order to amplify an amount of signal of the read data; and
    write amplifiers provided for said regular cell array and said parity cell array, respectively, each of said write amplifiers being provided for each bit of write data in order to amplify an amount of signal of the write data, and wherein
    said switch circuit is constituted of a plurality of sub switch circuits corresponding to the bits of the read/write data, respectively, and
    each of the sub switch circuits has
    a write selector outputting the write data to the write amplifier of one of said regular cell array and said parity cell array, and
    a read selector outputting to a data line the read data from the read amplifier of one of said regular cell array and said parity cell array.

4. The semiconductor memory according to claim 3, further comprising:
    a write amplifier control circuit generating a regular write amplifier control signal causing said write amplifiers of said regular cell array to operate, and generating a parity write amplifier control signal causing said write amplifiers of said parity cell array to operate; and
    a write amplifier switch circuit exchanging the regular write amplifier control signal and the parity write amplifier control signal with each other.

5. The semiconductor memory according to claim 4, further comprising
    a test control circuit activating a test signal in response to a test command in order to shift a state of the semiconductor memory from a normal operation mode to a test mode, and wherein
    said write amplifier switch circuit
    outputs the regular write amplifier control signal to said write amplifiers of said parity cell array and outputs the parity write amplifier control signal to said write amplifiers of said regular cell array, in the test mode during which the test signal is active, and
    outputs the regular write amplifier control signal to said write amplifiers of said regular cell array and outputs the parity write amplifier control signal to said write amplifiers of said parity cell array, in the normal operation mode during which the test signal is inactive.

6. The semiconductor memory according to claim 1, further comprising:
    a plurality of regular cell arrays to/from which the regular data inputted/outputted to/from the external data terminal are read/written; and
    a data line through which the regular data and the parity data are inputted/outputted to/from said regular cell arrays and said parity cell array, wherein
    the write data received at the external data terminal is read/written to/from one of the regular cell arrays according to an address, and
    said switch circuit is disposed between said data line, and a predetermined one of said regular cell arrays and said parity cell array, and exchanges the regular data, which are read/written to/from said predetermined one of said regular cell arrays, with the parity data.

7. The semiconductor memory according to claim 1, further comprising:
    a data line connected between said switch circuit, and said regular cell array and said parity cell array, and transmitting the regular data and the parity data; and
    a syndrome generation circuit generating a syndrome according to the regular data and the parity data supplied via the data line in order to notify said error correction circuit of an erroneous bit, wherein
    said syndrome generation circuit has a switch part that switches a bit of the regular data, having been exchanged with a bit of the parity data by said switch circuit, back to a bit of the original regular data.

8. The semiconductor memory according to claim 7, wherein
    both the bit of the regular data and the bit of the parity data exchanged with each other by the switch circuit are included in an arithmetic expression expressing logic of said syndrome generation circuit for generating each bit of the syndrome.

9. The semiconductor memory according to claim 8, wherein:
said syndrome generation circuit includes an exclusive-OR circuit generating the syndrome; and
the switch part is incorporated in the exclusive-OR circuit.

10. A semiconductor memory comprising:
a regular cell array from/to which regular data inputted/outputted to/from an external data terminal is read/written;
a parity generation circuit generating parity data from the regular data:
a parity cell array from/to which the parity data is read/written;
an error correction circuit correcting the read data from said regular cell array according to the parity data;
inversion circuits each inverting a logical value of at least one bit of the parity data inputted/outputted to/from said parity cell array, according to an inversion control signal; and
an inversion control circuit generating the inversion control signal.

11. The semiconductor memory according to claim 10, wherein:
said inversion circuits each have sub inversion circuits corresponding to all bits of the parity data, respectively; and
said inversion control circuit generates the inversion control signal for each of the sub inversion circuits.

12. The semiconductor memory according to claim 10, wherein:
said inversion circuits each have sub inversion circuits corresponding to part of bits of said parity data, respectively; and
said inversion control circuit generates the inversion control signal common to the sub inversion circuits.

13. The semiconductor memory according to claim 12, further comprising
a dummy sub inversion circuit formed for the remaining bits of the parity data and having a same circuit configuration as that of the sub inversion circuits, wherein
said dummy sub inversion circuit receives the inversion control signal thereof at a terminal that is fixed to logic level that makes an inversion function ineffective.

14. The semiconductor memory according to claim 10, wherein:
said parity cell array has a plurality of memory cells and a plurality of word lines connected to the memory cells; and
said inversion control circuit sets logic level of the inversion control signal according to a selection address of the word lines.

15. The semiconductor memory according to claim 10, wherein
each of the inversion circuits inverts both of read data and write data when the inversion control signal indicates effectiveness, while non-inverting both of the read data and the write data when the inversion control signal indicates ineffectiveness.

16. The semiconductor memory according to claim 10, wherein
said inversion control circuit generates the inversion control signal according to a pattern of test data read/written from/to said regular cell array.

* * * * *